(12) United States Patent
Yoo et al.

(10) Patent No.: US 11,316,485 B2
(45) Date of Patent: Apr. 26, 2022

(54) DIGITAL WIRELESS TRANSMITTER WITH MERGED CELL SWITCHING AND LINEARIZATION TECHNIQUES

(71) Applicant: Board of Trustees of Michigan State University, East Lansing, MI (US)

(72) Inventors: Sangmin Yoo, Okemos, MI (US); Si-Wook Yoo, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 17/026,545

(22) Filed: Sep. 21, 2020

(65) Prior Publication Data
US 2021/0006217 A1 Jan. 7, 2021

Related U.S. Application Data

(63) Continuation of application No. 16/355,089, filed on Mar. 15, 2019, now Pat. No. 10,804,864.

(60) Provisional application No. 62/758,816, filed on Nov. 12, 2018, provisional application No. 62/644,073, filed on Mar. 16, 2018.

(51) Int. Cl.
*H03F 3/24* (2006.01)
*H04B 1/04* (2006.01)
*H03F 1/02* (2006.01)

(52) U.S. Cl.
CPC ............. *H03F 3/24* (2013.01); *H03F 1/0244* (2013.01); *H04B 1/04* (2013.01); *H03F 2200/267* (2013.01); *H03F 2200/336* (2013.01); *H03F 2200/387* (2013.01); *H03F 2200/451* (2013.01)

(58) Field of Classification Search
CPC .... H03F 3/24; H03F 1/0244; H03F 2200/387; H03F 2200/336; H03F 2200/267; H03F 2200/451; H03F 2200/456; H03F 3/2173; H03F 3/245; H04B 1/04; H04B 1/0007; H04B 2001/0408
See application file for complete search history.

(56) References Cited

U.S. PATENT DOCUMENTS

2016/0336909 A1* 11/2016 Walling .................. H03F 3/217
2019/0280688 A1* 9/2019 Ruffieux ................ H03K 3/011

OTHER PUBLICATIONS

S. Yoo et al., "A Class-G Switched-Capacitor RF Power Amplifier," in IEEE Journal of Solid-State Circuits, vol. 48, No. 5, pp. 1212-1224, May 2013, doi: 10.1109/JSSC.2013.2252754. (Year: 2013).*

(Continued)

*Primary Examiner* — Sam K Ahn
*Assistant Examiner* — Amneet Singh
(74) *Attorney, Agent, or Firm* — Harness Dickey & Pierce PLC

(57) ABSTRACT

A vector distribution method for operation of a power amplifier of a wireless transmitter including receiving, by a first amplifier circuit, a first input vector and a second input vector. The first input vector includes data derived from an input signal of the wireless transmitter and the second input vector includes other data derived from the input signal of the wireless transmitter. The method includes, in response to receiving the input signal, instructing the first amplifier circuit to output an output signal at a high voltage.

18 Claims, 33 Drawing Sheets

(56) References Cited

OTHER PUBLICATIONS

Ritesh Bhat, et al., A >1W 2.2GHz Switched-Capacitor Digital Power Amplifier with Wideband Mixed-Domain Multi-Tap FIR Filtering of OOB Noise Floor, ISSCC 2017 / Session 13 / High-Performance Transmitters /13.10, Feb. 7, 2017.

* cited by examiner

DIGITAL WIRELESS TRANSMITTER WITH MERGED CELL SWITCHING AND LINEARIZATION TECHNIQUES

CROSS REFERENCE

This application is a continuation of U.S. patent application Ser. No. 16/355,089, filed on Mar. 15, 2019. This application claims benefit of U.S. Provisional Application No. 62/644,073, filed on Mar. 16, 2018 and U.S. Provisional Application No. 62/758,816, filed on Nov. 12, 2018. The entire disclosures of the above applications are incorporated herein by reference.

FIELD

The present disclosure relates to techniques to improve linearity and energy efficiency of digital wireless transmitters with merged cell switching.

BACKGROUND

The demand for high-performance transmitter with energy-, area-, and spectral-efficiency is higher than ever in the era of multi-standards wireless communication systems with very high data throughput. Driven by the unquenched evolution of process technology, digital transmitters have gained significant interest in the modern wireless communication system. Among this, a switched-capacitor power amplification (SCPA) technique has shown a substantial opportunity with its great energy-efficiency, small area, and linearity because it merges many transmitter building blocks in a single circuit block that generates high output power at a superior power efficiency. The advantages become more attractive with the innovation of process technology well aligned with Moore's Law because the operation of SCPA technology is highly related to switches, and its performance and size scales well with the process migration and evolution.

Digital power amplifier (DPA), digital transmitter, or RF digital-to-analog converter (DAC) consist of unit cells that generate variable output voltage (amplitude) and phase, which is combined at the DPA output. For sub-DPA cells, each of the unit cells can receive only individual amplitude and phase information as input because it has only includes one digital mixer to process the information. The mixer mixes a baseband (BB) amplitude signal and an RF carrier signal, generating a DC signal (no RF output, when BB amplitude signal is 0) or RF signal. The output signal from each unit cell is combined at the output and it relates to its amplitude signal.

Class-G technique, which employs multiple supply voltage, was proposed to increase the resolution and power efficiency of DPA. The Class-G technique can increase the resolution of the DPA without increasing the number of the sub-DPA cells because several sub-DPA cells can be merged into one by adopting multiple supply voltages. However, such a conventional Class-G approach is not available for sub-DPA cells which have both amplitude and phase information (e.g. quadrature-modulated signal or multi-phase signal) because each sub-DPA cell has only one mixer that cannot process signals with different phase information at the same time.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A vector distribution method for operation of a power amplifier of a wireless transmitter including receiving, by a first amplifier circuit, a first input vector and a second input vector. The first input vector includes data derived from an input signal of the wireless transmitter and the second input vector includes other data derived from the input signal of the wireless transmitter. The method includes, in response to receiving the input signal, instructing the first amplifier circuit to output an output signal at a high voltage. The output signal is modulated with the first input vector and the second input vector, where the first input vector and the second input vector are the same.

The method further includes, in response to receiving the input signal: (i) instructing the first amplifier circuit to output the output signal at a low voltage, the output signal being modulated with the first input vector and (ii) distributing the second input vector to another amplifier circuit. The another amplifier circuit is instructed to output another signal at the low voltage. The another signal is modulated with the second input vector, where the first input vector is different from the second input vector. The method also includes, in response to receiving the input signal, instructing the first amplifier circuit to output the output signal at the low voltage. The output signal is modulated with the first input vector, where the input signal includes data of the first input vector and no data of the second input vector. The method includes, in response to not receiving the input signal, deactivating the first amplifier circuit.

In other aspects, the method also includes, in response to receiving the input signal, instructing the first amplifier circuit to output the output signal at the low voltage and distributing the second input vector to another amplifier circuit. The output signal is modulated with the first input vector and the another amplifier circuit is instructed to output another signal at the low voltage. The another signal is modulated with the second input vector, and the first input vector and the second input vector are the same. In other aspects, in response to at least one of: (i) receiving a single input vector derived from the input signal and (ii) not receiving the input signal, selectively obtaining a distributed input vector from the another amplifier circuit. The method further includes instructing the first amplifier circuit to output the output signal at the at least one of: (i) high voltage and (ii) low voltage, the output signal being modulated with the distributed input vector, and the single input vector is at least one of: (i) a combination of the first input vector and the second input vector, (ii) the first input vector, and (iii) the second input vector.

A digital power amplifier (DPA) of a wireless transmitter including a first amplifier circuit configured to receive, by a controller, a first input vector and a second input vector. The first input vector includes data derived from an input signal of the wireless transmitter and the second input vector includes other data derived from the input signal of the wireless transmitter. The DPA includes, in response to receiving the input signal, instructing, by the controller, the first amplifier circuit to at least one of: (i) outputting an output signal at a high voltage, the output signal being modulated with the first input vector and the second input vector, and (ii) outputting the output signal at a low voltage and distribute the second input vector to another amplifier circuit, the output signal being modulated with the first input vector and the another amplifier circuit is instructed to output another signal at the low voltage, the another signal being modulated with the second input vector. The first input vector and the second input vector are the same.

The DPA further includes, in response to receiving the input signal: (i) instructing, by the controller, the first amplifier circuit to output the output signal at the low voltage, the output signal being modulated with the first input vector and (ii) distributing the second input vector to the another amplifier circuit. The another amplifier circuit is instructed to output the another signal at the low voltage. The another signal is modulated with the second input vector. The first input vector is different from the second input vector. The DPA also includes, in response to receiving the input signal, instructing, by the controller, the first amplifier circuit to output the output signal at the low voltage. The output signal is modulated with the first input vector, and the input signal includes data of the first input vector and no data of the second input vector.

The DPA includes, in response to not receiving the input signal, deactivating, by the controller, the first amplifier circuit. The another amplifier circuit is configured to selectively receive, by the controller, the second input vector when the second input vector is distributed, where the another amplifier circuit generates another signal modulated with the second input vector. Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

DETAILED DESCRIPTION

Figure 1:
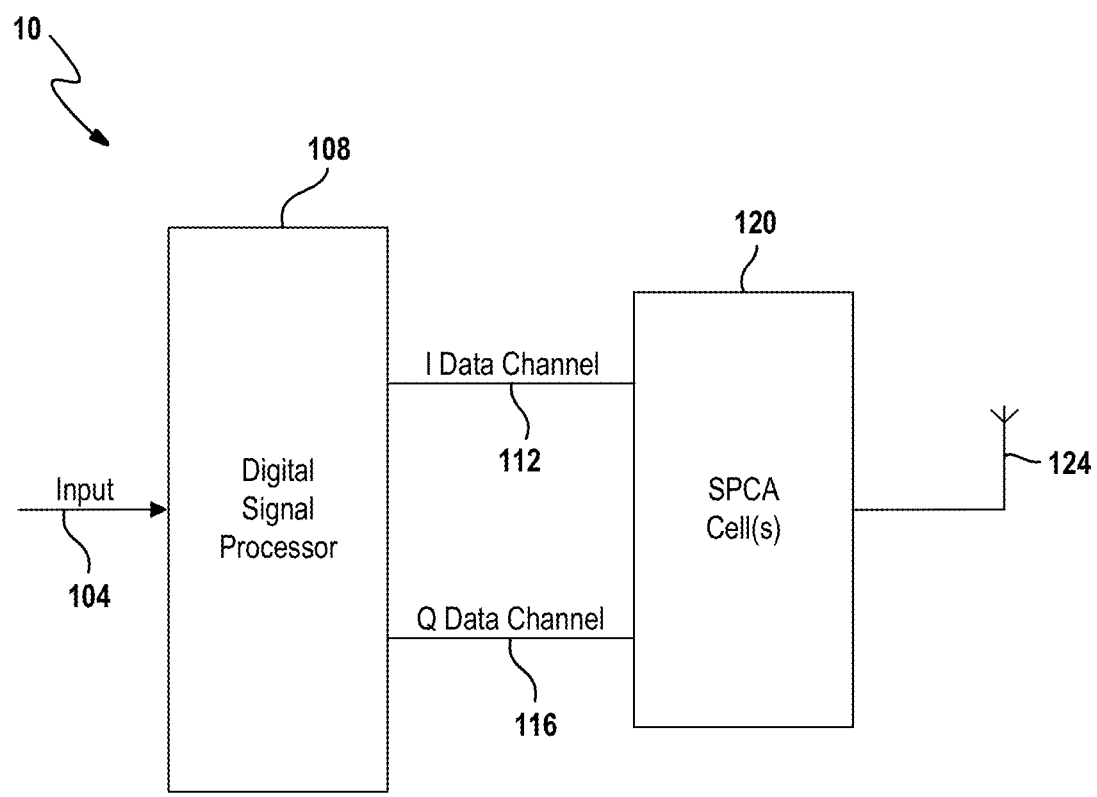
FIG. 1 is an exemplary functional block diagram illustrating a digital wireless transmitter including a merged switched-capacitor power amplifier (SCPA).

A merged cell switching (MCS) technique to improves the operation of a digital power amplifier (DPA) by processing input data according to a control algorithm. The "merged cell" can have multiple input vectors because it aggregates several unit cells with different input vectors and merges the different input vectors into a single cell. However, as described previously, a single cell can process only one phase (vector) information because it has a single mixer. In order to process all the vectors at the same time without the loss of any information, the remaining vectors should be distributed to other cells and conserved. Such a distribution of the vector results in the vector "switching" technique, as further described below.

In an example embodiment, a 30.1 dBm quadrature transmitter is implemented based on Class-G IQ-Cell shared switched-capacitor power amplifier (SCPA) and voltage mismatch compensation techniques for dual-supply voltage in a Class-G SCPA. For the Class-G operation in the IQ-Cell shared quadrature SCPA, a merged cell switching (MCS) technique comprising vector amplitude switching (VAS) and vector phase switching (VPS) is proposed. The VAS boosts system efficiency (SE) by enabling Class-G operation with multiple supply voltages and the VPS conserves vector information in the merged cells that process the quadrature vectors. The linearization technique for Class-G SCPA minimizes the distortion that arises from supply-voltage mismatches in a multiple supply-voltage system. Two SCPAs are coupled with a power combining transformer to achieve a watt-level output power. A time-domain interpolation minimizes the spectral image. The prototype SCPA, fabricated in 65 nm CMOS, achieves peak output power and SE of 30.1 dBm and 37.0%, respectively. It achieves EVM of −40.7 dB (−40.3 dB) and SE of 14.7% (18.3%) at an average output power of 19.5 dBm (22.5 dBm) with 802.11g 64-QAM OFDM signal with 10.6 dB PAPR (20 MHz single-carrier 256-QAM signal with 7.6 dB PAPR).

As wireless communication standards evolve, transmitter systems with higher linearity and wider bandwidth at increased RF output power are required to meet the enormous demand for faster communication speed and increased data traffic. In contrast, mobile and wearable applications demand a smaller form factor and low-cost solution. Low power consumption is also critical for increased battery life, improved user experience, and in multi-standard and MIMO systems with multiple transceivers in a single system.

Digital transmitters or digital power amplifiers (DPA) have shown great promise toward small low-power transmitters. Digital transmitters can save a significant amount of power consumption and area because they merge the function of the digital-to-analog converter (DAC), mixer, driving amplifier, and power amplifier into a single circuit block. The DPA becomes more attractive with improved process technology, which provides faster switching and finer segmentation at a lower power dissipation. Among the DPA architectures, the switched-capacitor power amplifier (SCPA) has been widely investigated because of its high energy efficiency and superior linearity. The SCPA does not suffer from the signal distortion associated with the large output signal swing in current cells. This is unlike conventional power amplifiers and current-mode DPAs in which the output impedance is modulated with a large output signal swing. Modulated output resistance and capacitance for large signals lead to AM-AM or AM-PM distortions.

Referring now to FIG. 1, an exemplary high-level functional block diagram illustrating an example digital wireless transmitter 100 is shown. In various embodiments, the method described below may be implemented in a digital power amplifier (DPA) or RF digital-to-analog converter (DAC). The digital wireless transmitter 100 receives an input signal 104. A digital signal processor 108 receives the input signal 104 and performs appropriate processing on the input signal 104, including digital-to-analog conversion, filtering, and/or amplification of the input signal 104. In various embodiments, the digital wireless transmitter 100 may be included in a transceiver implementation configured to receive and transmit signals.

After being processed by the digital signal processor 108, the input signal 104 is converted into two channels of data: an in-phase (I) data channel 112 and a quadrature (Q) data channel 116. The I data channel 112 and the Q data channel 116 are modulated with a signal to transmit the information contained in each channel. An SCPA cell 120 receives the I data channel 112 and the Q data channel 116 and is configured to modulate the IQ data with signals using dual power supplies for low power and high power applications. One obstacle overcome by the SCPA cell 120 is processing both data channels using a single cell. As described in more detail below, a switching technique in the SCPA cell 120 is implemented to transmit all data included on both channels, resulting in the transmission of all IQ data using a single cell via an antenna 124.

Figure 2A:
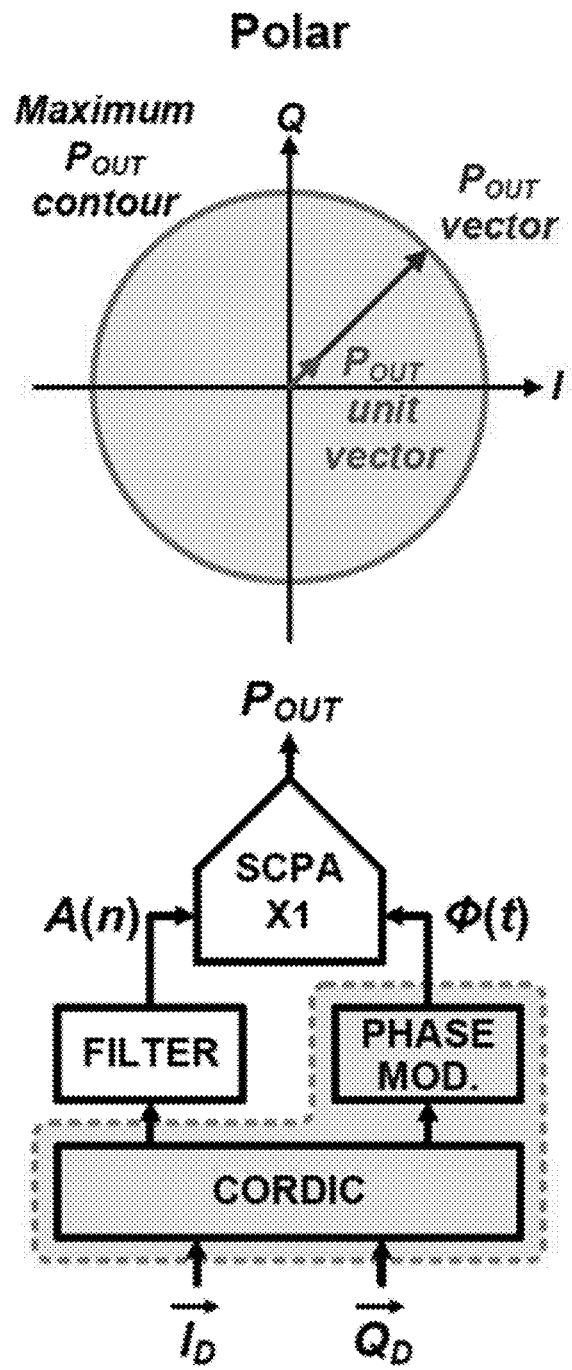
FIG. 2A is an exemplary functional block diagram illustrating a polar SCPA and a chart illustrating a power output of the polar SCPA.
Figure 2B:
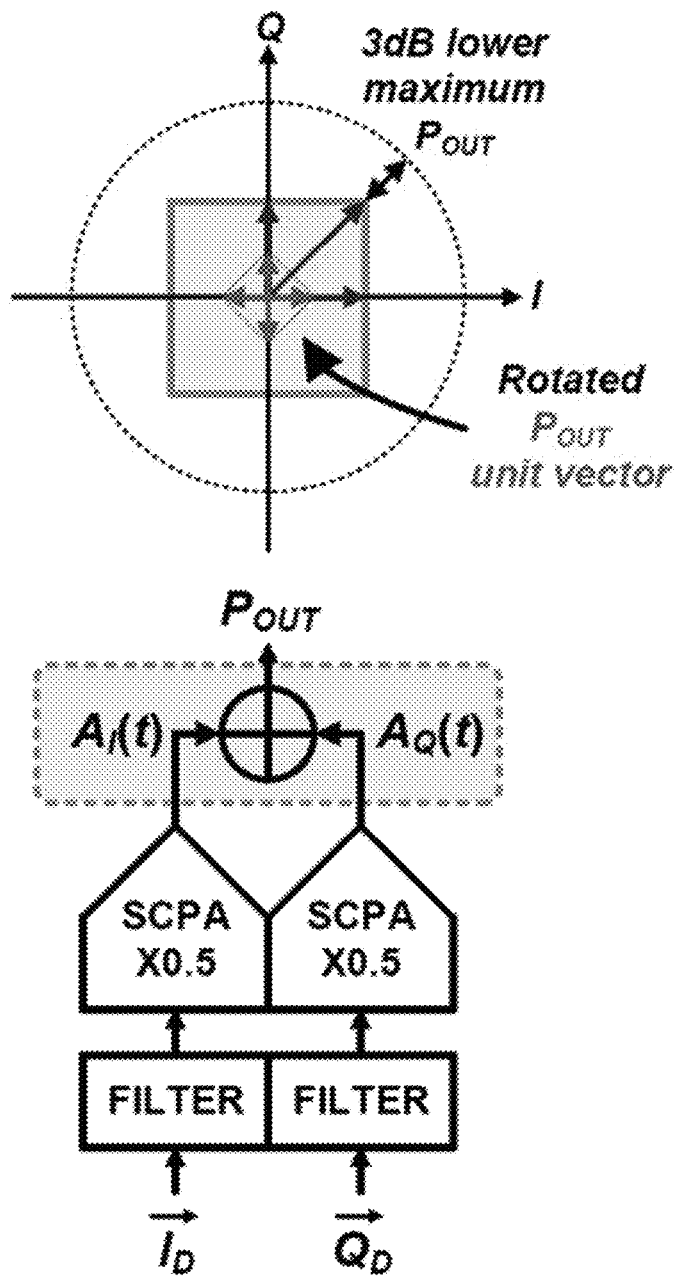
FIG. 2B is an exemplary functional block diagram illustrating a conventional quadrature SCPA and a chart illustrating a power output of the conventional quadrature SCPA.

The polar transmitter illustrated in FIG. 2A shows a large output power and a high efficiency because it can transmit maximum output power to every angle with high energy efficiency. However, it requires a complex coordinate rotation digital computer (CORDIC) and a wideband phase modulator. Additionally, it is not easy to precisely align amplitude and phase data in two separate paths, and the mismatch between the two paths leads to signal distortion. On the other hand, a quadrature architecture, as shown in FIG. 2B, demonstrates a simple structure and a wide bandwidth without a supply modulator or CORDIC. However, it exhibits a lower output power with degraded efficiency because the output signal needs to be represented using two orthogonal in-phase (I) and quadrature (Q) vectors.

Figure 2C:
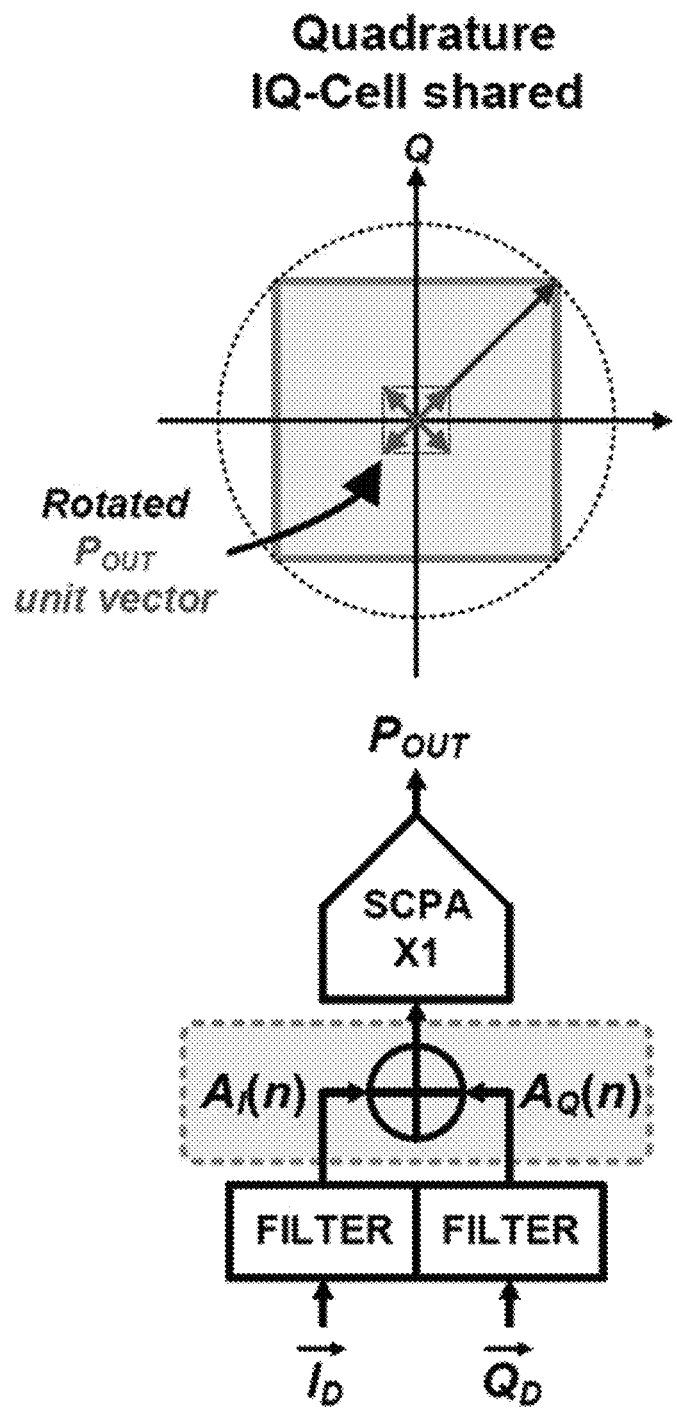
FIG. 2C is an exemplary functional block diagram illustrating a quadrature IQ-Cell shared SCPA and a chart illustrating a power output of the quadrature IQ-Cell shared SCPA.
Figure 3:
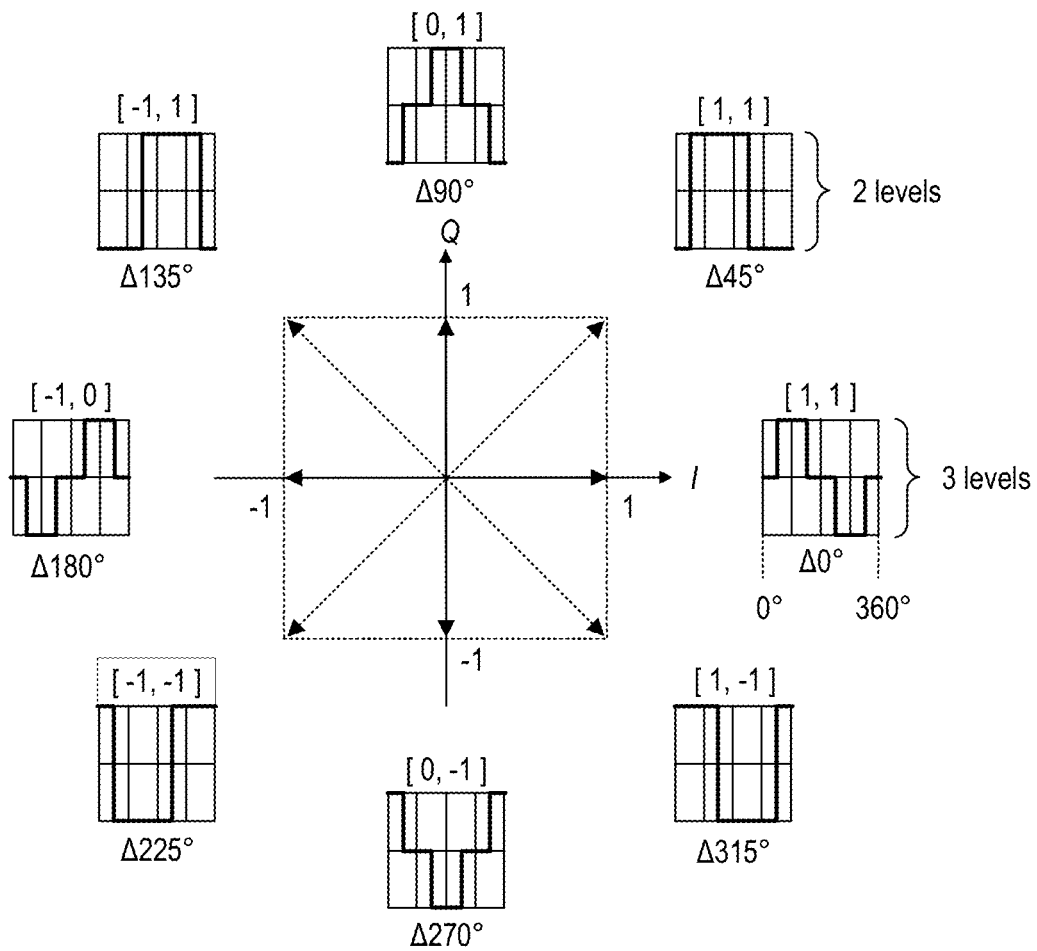
FIG. 3 is a graphical depiction showing four-phase unit vectors generated from the IQ combination.

In addition, a conventional quadrature SCPA with dedicated arrays for I and Q demonstrates efficiency degradation because the split, dedicated IQ arrays operate with a 90° phase difference, and the unswitched capacitor array adds extra loading to switching cells. As a result, this fixed IQ array architecture shows 3-6 dB lower output power and a degraded drain efficiency compared to those of the equivalent polar SCPA. A quadrature IQ-Cell shared SCPA architecture, shown in FIG. 2C, provides increased output power and energy efficiency in a quadrature architecture with an IQ input signal. It first combines I and Q unit vectors in the digital domain and then generates a set of new IQ-combined unit vectors which are 45° phase shifted from I and Q. It delivers the maximum output power at 45°/135°/225°/315° in which signals can be represented with a single IQ-combined unit vector. FIG. 3 describes the four-phase unit vectors generated from the IQ combination. The IQ-combined unit vectors and their I and Q component vectors are denoted by [i, q], [i, 0], and [0, q], respectively, where both i and q are ±1.

Figure 4A:
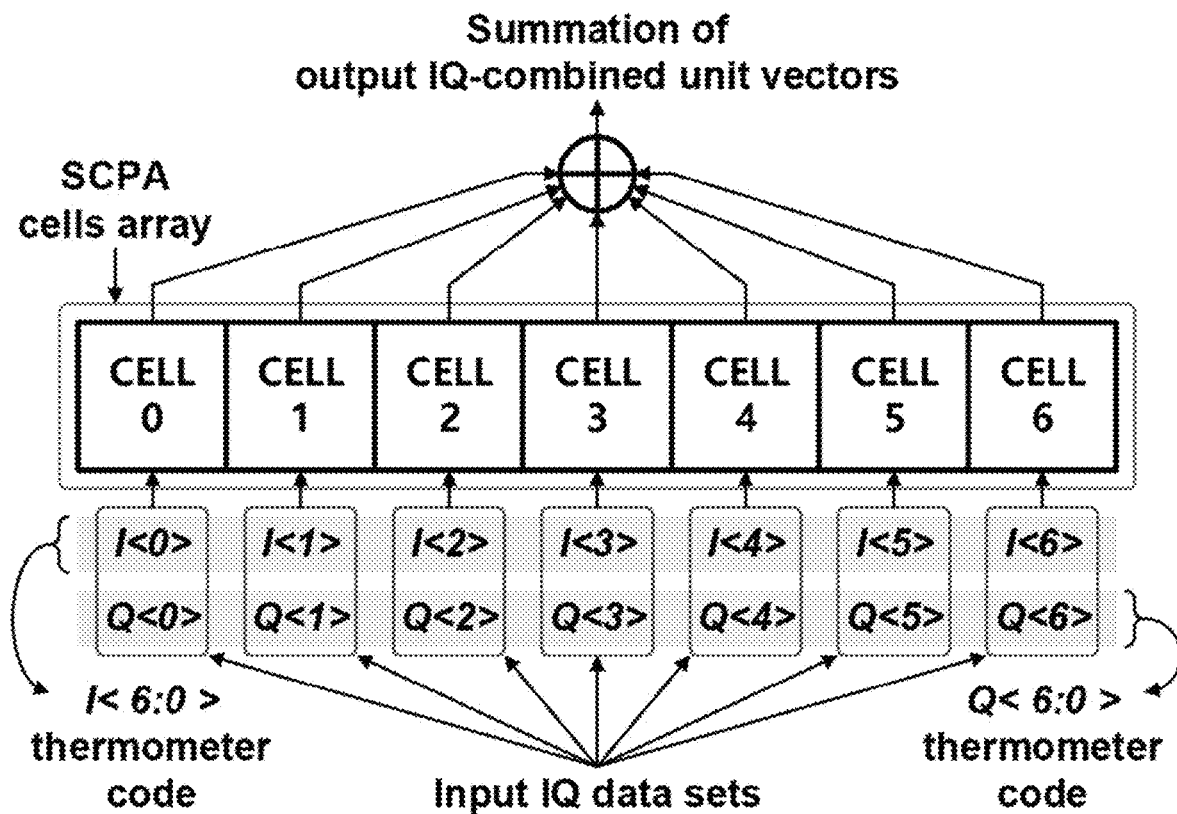
FIG. 4A is an exemplary functional block diagram showing an example three bit quadrature IQ-Cell shared SCPA.
Figure 4B:
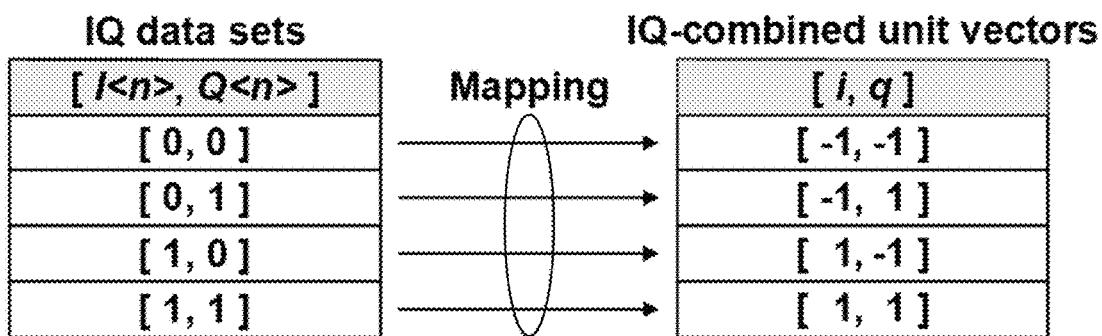
FIG. 4B is a table showing example input IQ data sets and their corresponding IQ-combined unit vectors.

In FIG. 3, a conceptual three-level local oscillator (LO) signal is employed for the IQ vectors that yield a two-level IQ-combined LO signal. Second, all the SCPA cells can be assigned to the same vector simultaneously because there are no dedicated IQ arrays as shown in FIGS. 4A-B. For example, a 3-bit SCPA operates with seven pairs of thermometer codes I<6:0> and Q<6:0> that comprise IQ data set [I<n>, Q<n>] of each SCPA cell as described in FIG. 4A. Each cell outputs one of the four IQ-combined unit vectors as shown in FIG. 4B, and they are combined at the capacitive summing node of the SCPA. As a result, the quadrature IQ-Cell shared SCPA achieves an increased output power and drain efficiency without any designated IQ arrays.

The enhanced-efficiency Class-G SCPA boosts the average drain efficiency by introducing an additional efficiency peak in the power back-off (PBO) region without any discontinuity in efficiency and linearity. The efficiency enhancement is more significant in the SCPA due to the seamless transition between supply voltages; each unit cell in the array can operate with different supply voltages at the same time because capacitors provide the isolation between different supply voltages as a DC-blocking component. Moreover, the transition can be achieved without any glitches in the transient waveform if the supply voltage transitions when the switches are connected to a common signal ground. However, the Class-G technology applied to a polar SCPA architecture cannot be directly applied to the quadrature IQ-Cell shared architecture because the capacitors are shared between I and Q.

There are challenges in both amplitude and phase linearity when multiple supply voltages are used in Class-G operation. Supply voltage mismatch directly affects the amplitude and phase distortion of the output signal. Ideally, the supply voltage $V_{DD2}$ should be exactly twice $V_{DD}$ to conserve linearity unless digital predistortion (DPD) or asymmetric coding schemes are applied. Although the enhanced-efficiency Class-G technique with gradual supply voltage transition can maintain the monotonicity of the output signal even with the mismatch, its linearity is still sensitive to supply voltage variation and should be calibrated or predistorted. Moreover, in addition to the voltage mismatch, the output signal swings with the different supply voltages can result in different signal delays and phase distortions.

Output Power and Efficiency of Switched-Capacitor Power Amplifier

Figure 5:
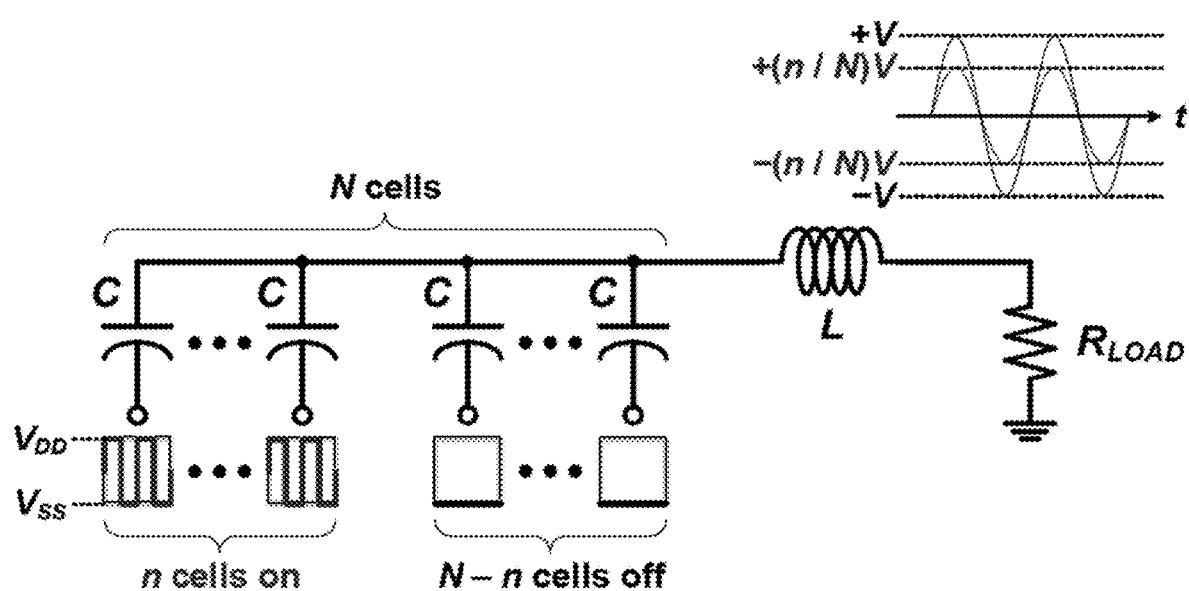
FIG. 5 is an exemplary schematic showing a basic SCPA architecture.

FIG. 5 shows a simplified schematic of the conventional SCPA architecture. The unit capacitors in the capacitor array are selectively switched at RF frequency to generate RF output power. The square wave at the top plate of the capacitors is filtered by an ideal bandpass network assuming an ideal inductor in series with the capacitor array. Only a fundamental component is delivered at the output assuming the filter is ideal. To calculate the output power and ideal drain efficiency of the SCPA, the equivalent circuit of the capacitor array is connected in series with an inductor L and output resistor $R_{LOAD}$ as shown in FIG. 5. The capacitor array in both polar and quadrature architectures are detailed in FIGS. 6A-B and 8A-C. For the sake of simplicity, the numbers of capacitors switched at RF frequency (On) and unswitched (Off) are depicted in a bar chart that demonstrates the operation of capacitors in the capacitor array. The vectors with different phases are illustrated as square waves with different delays on top of the bar chart. A vector distribution from the switched to the unswitched capacitors for enhanced-efficiency Class-G operation is illustrated with arrows and square waves in FIGS. 6B and 8C.

Figure 6A:
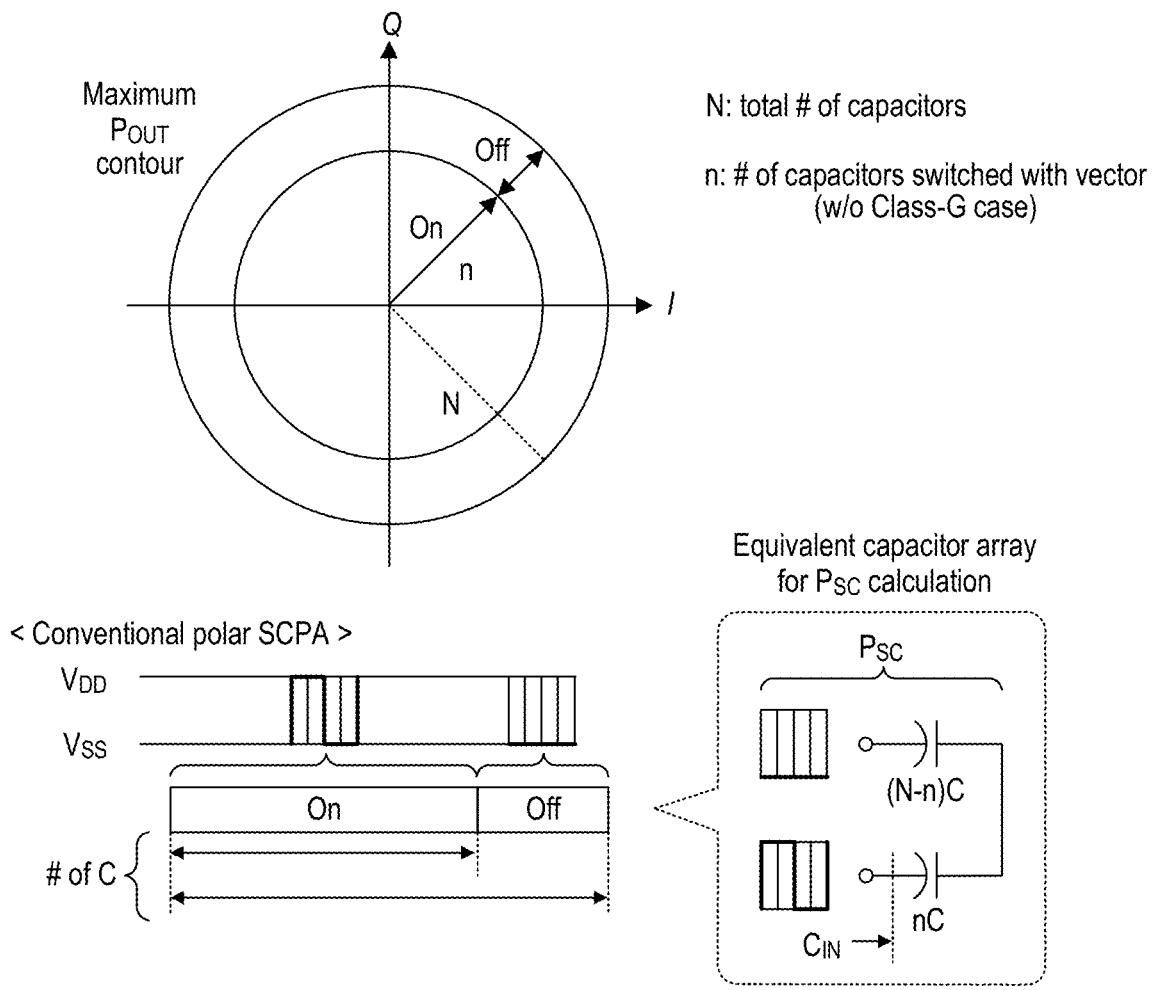
FIG. 6A is a graphical depiction showing operation of a conventional SCPA in a polar transmitter.

The fundamental component of output voltage and power in the conventional polar SCPA, shown in FIG. 6A, is:

$$|V_{OUT}| = \frac{2}{\pi}\frac{n}{N}V_{DD} \quad (1)$$

$$P_{OUT} = \frac{1}{2}\frac{|V_{OUT}|^2}{R_{OPT}} = \frac{2}{\pi^2}\left(\frac{n}{N}\right)^2\frac{V_{DD}^2}{R_{OPT}}. \quad (2)$$

where N, n, and $R_{OPT}$ are the total number of SCPA capacitors ($C_{TOT}$), the number of capacitors switched between $V_{DD}$ and $V_{SS}$, and the output resistance for the desired peak output power, respectively. The $2/\pi$ is the Fourier coefficient for the fundamental frequency of the square wave.

Assuming very fast switching operation, the dynamic power dissipation of the SCPA in the capacitor array ($P_{SC}$) is given by:

$$P_{SC} = C_{IN}V_{DD}^2 f = \left[\frac{n(N-n)}{N^2}\right]C_{TOT}V_{DD}^2 f. \quad (3)$$

where $C_{IN}$ is the series capacitance of the selected n and unselected N-n capacitors as shown in FIG. 6A. The ideal drain efficiency of the SCPA is given by:

$$\eta_{IDEAL} = \frac{P_{OUT}}{P_{OUT} + P_{SC}}. \quad (4)$$

Figure 7A:
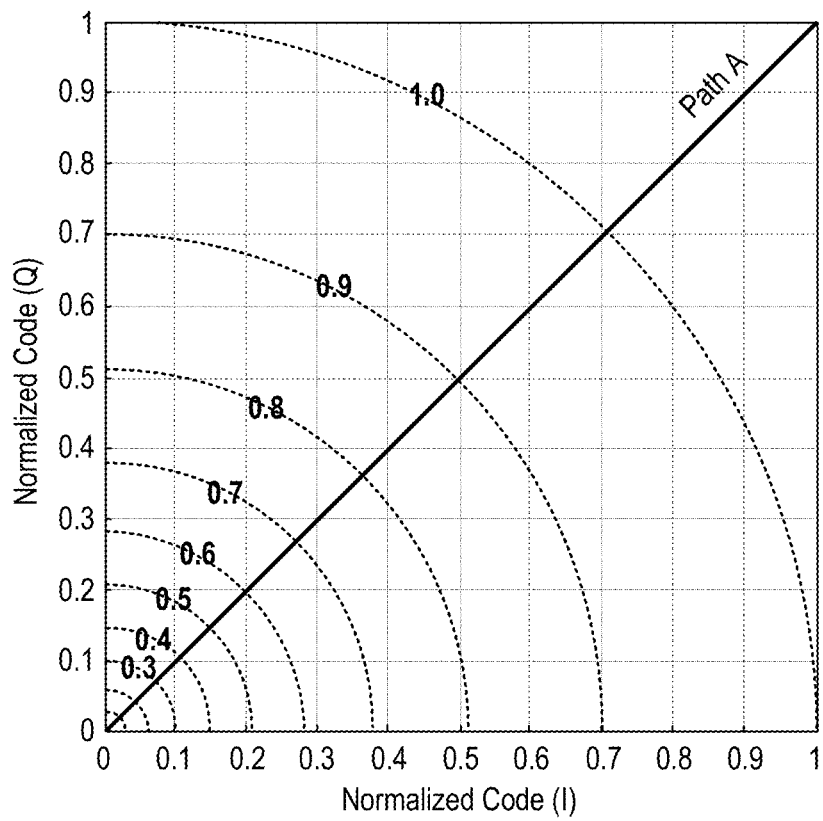
FIG. 7A is a graphical depiction showing a theoretical two-dimensional drain efficiency map for quadrant 1 when $Q_{LOAD}$ is 3 of a conventional polar SCPA.
Figure 7A:
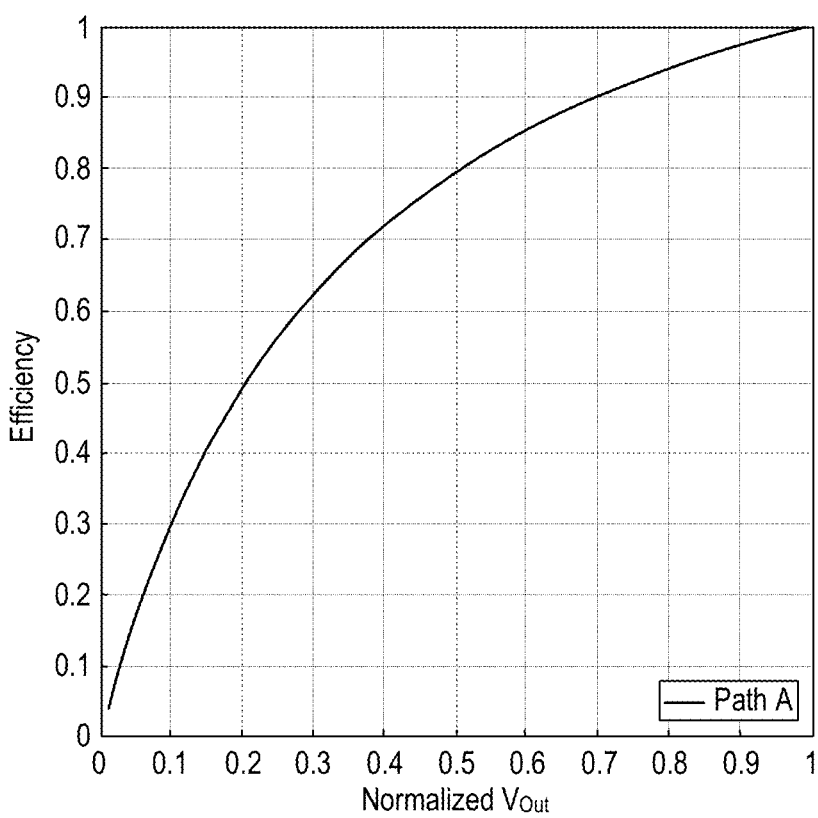

Substitution of (2) and (3) into (4) yields the drain efficiency, as illustrated in FIG. 7A in two-dimensional IQ domain and in one dimension as shown in Path A.

A loaded quality factor ($Q_{LOAD}$) of three for the output matching network is used for the efficiency calculation throughout this section. The $Q_{LOAD}$ is defined as $$Q_{LOAD} = \frac{2\pi fL}{R_{OPT}} = \frac{1}{2\pi fC_{TOT}R_{OPT}}. \quad (5)$$

For higher drain efficiency, a high $Q_{LOAD}$ is preferred because the $P_{SC}$ is inversely proportional to the $C_{TOT}$ which is the capacitance of the output matching network.

Enhanced-Efficiency Class-G SCPA

Figure 6B:
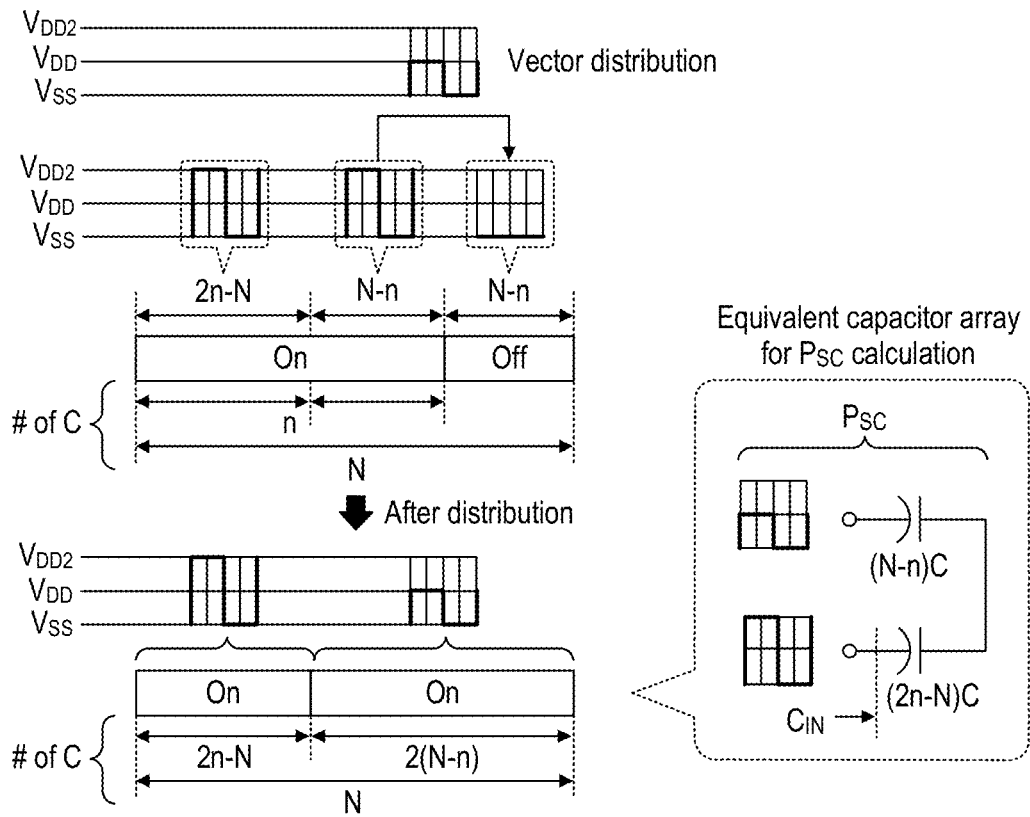
FIG. 6B is a graphical depiction showing operation of a Class-G SCPA with dual supply voltage in a polar transmitter.

The drain efficiency of a Class-G SCPA using a dual-supply voltage, $V_{DD2}$ and $V_{DD}$, is detailed in FIG. 6B. Ideally, the $V_{DD2}$ is twice $V_{DD}$. The total number of capacitors and input codes are defined as N and M, respectively, where M=2N. The number of selected cells is n, where $0 \leq n \leq N$ and the selected code is m, where $0 \leq m \leq M$. In the case of m≤N, the output voltage, power, and ideal drain efficiency can be expressed in the same way as the conventional SCPA (1)-(4) because the operation of both SCPAs is the same.

When m>N, the output voltage and power are given by the following expressions:

$$|V_{OUT}| = \frac{2}{\pi}\left[\left(\frac{n}{N}\right)V_{DD2} + \left(\frac{N-n}{N}\right)V_{DD}\right] \quad (6)$$

$$P_{OUT} = \frac{1}{2}\frac{|V_{OUT}|^2}{R_{OPT}} = \frac{2}{\pi^2}\left(\frac{N+n}{N}V_{DD}\right)^2\frac{1}{R_{OPT}}. \quad (7)$$

The dynamic power dissipation of the Class-G SCPA is:

$$P_{SC} = C_{IN}(V_{DD2}-V_{DD})^2 f = C_{IN}V_{DD}^2 f. \quad (8)$$

Figure 7B:
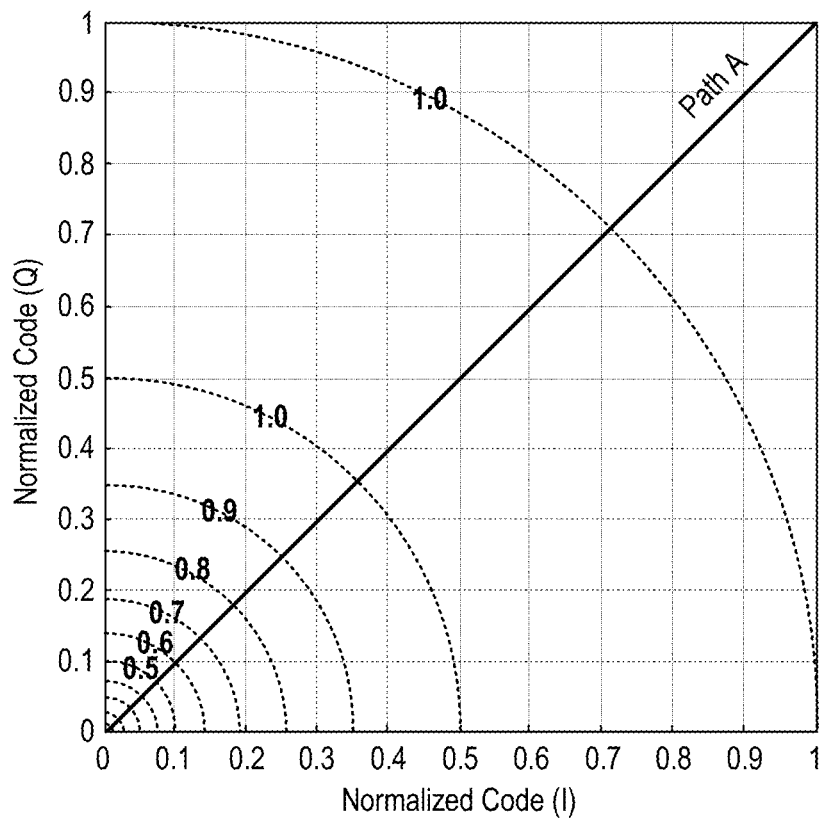
FIG. 7B is a graphical depiction showing a theoretical two-dimensional drain efficiency map for quadrant 1 when $Q_{LOAD}$ is 3 of a Class-G polar SCPA.
Figure 7B:
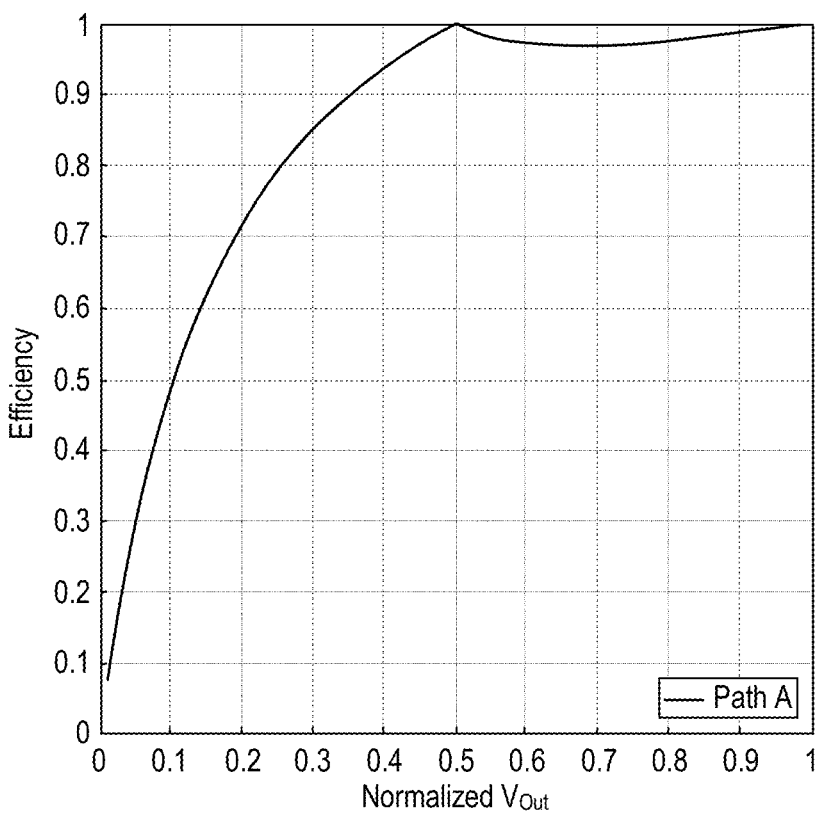

The ideal drain efficiency calculated using (4), (7), and (8) is shown in FIG. 7B.

Quadrature SCPA with Dedicated IQ Cells

Figure 8A:
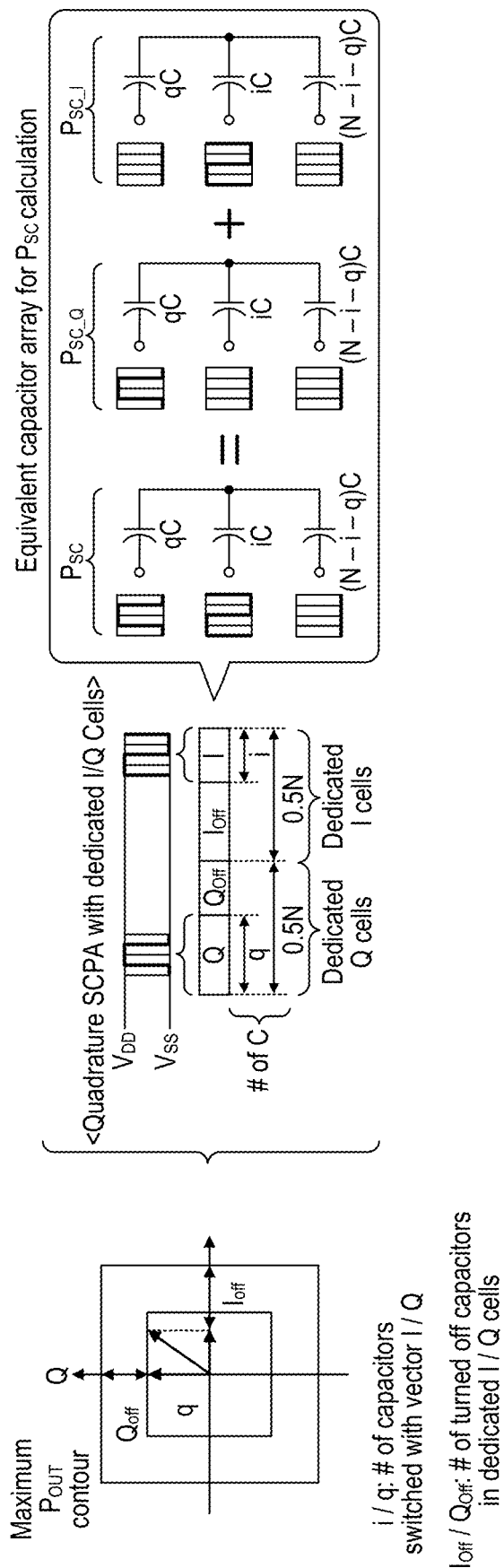
FIG. 8A is a diagrammatic view of an exemplary implementation of a quadrature SCPA with dedicated IQ Cells.

The conventional quadrature SCPA has two sub-SCPAs for 1 and Q signals as shown in FIG. 2B. The total number of capacitors is N and each sub-SCPA for the dedicated I and Q has half of the array as shown in FIG. 8A. Since the 1 and Q signals are orthogonal, the amplitude of the output voltage and power can be given by:

$$|V_{OUT}| = \frac{2}{\pi}\sqrt{\left(\frac{i}{N}\right)^2 + \left(\frac{q}{N}\right)^2} V_{DD} \qquad (9)$$

$$P_{OUT} = \frac{1}{2}\frac{|V_{OUT}|^2}{R_{OPT}} = \frac{2}{\pi^2}\left[\left(\frac{i}{N}\right)^2 + \left(\frac{q}{N}\right)^2\right]\frac{V_{DD}^2}{R_{OPT}}. \qquad (10)$$

where $0 \le i \le 0.5N$ and $0 \le q \le 0.5N$ are the number of capacitors switched between $V_{DD}$ and $V_{SS}$ for the I and Q SCPAs, respectively.

In the quadrature SCPA, the total dynamic power dissipation can be expressed as the sum of each dynamic power because the two independent quadrature signals operate with a different charge and discharge timing for their capacitors:

$$P_{SC} = P_{SC\_I} + P_{SC\_Q} \qquad (11)$$

$$P_{SC\_I} = \frac{i(N-i)}{N^2}C_{TOT}V_{DD}^2 f \qquad (12)$$

$$P_{SC\_Q} = \frac{q(N-q)}{N^2}C_{TOT}V_{DD}^2 f. \qquad (13)$$

Figure 9A:
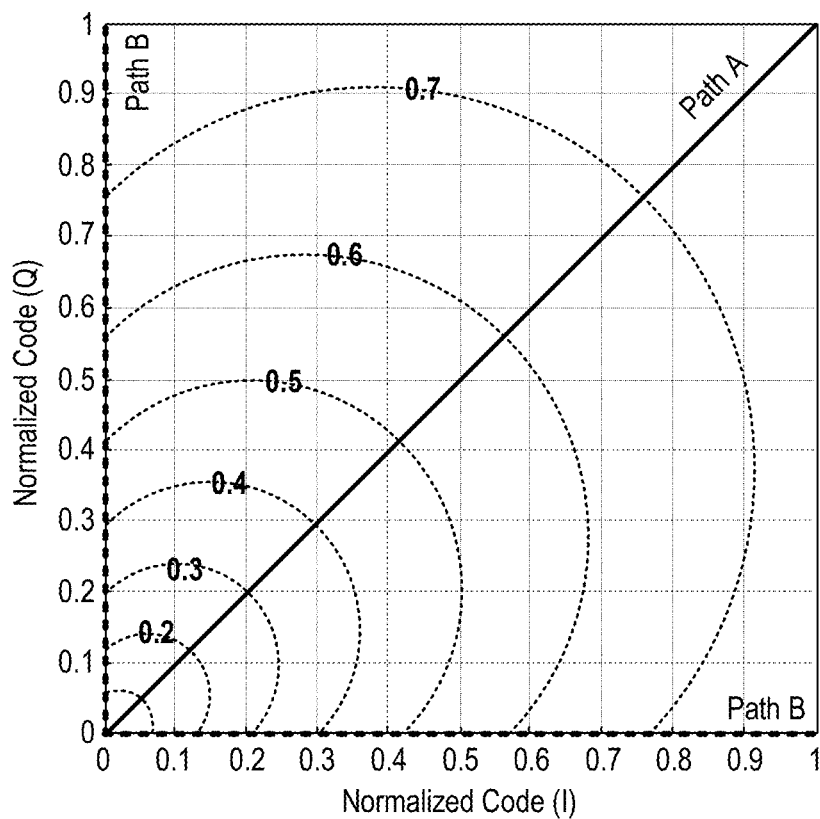
FIG. 9A is a graphical depiction showing a theoretical two-dimensional drain efficiency map for quadrant 1 when $Q_{LOAD}$ is 3 of a conventional quadrature SCPA of FIG. 8A.
Figure 9A:
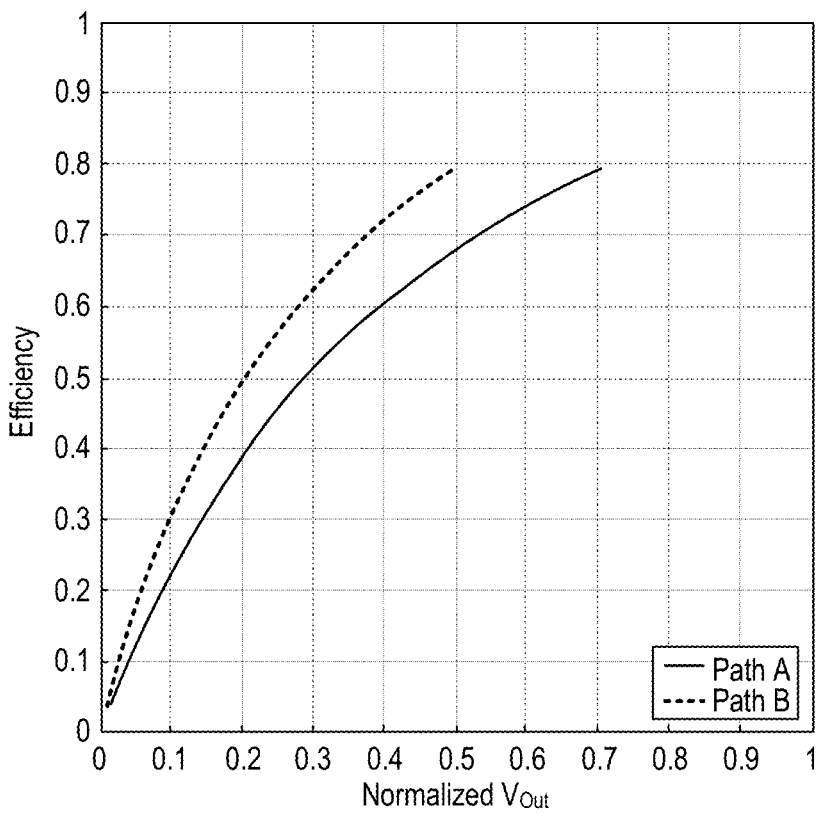

Therefore, the ideal drain efficiency is obtained from (4) and (10)-(13) and is illustrated in FIG. 9A.

Quadrature IQ-Cell Shared SCPA

Figure 8B:
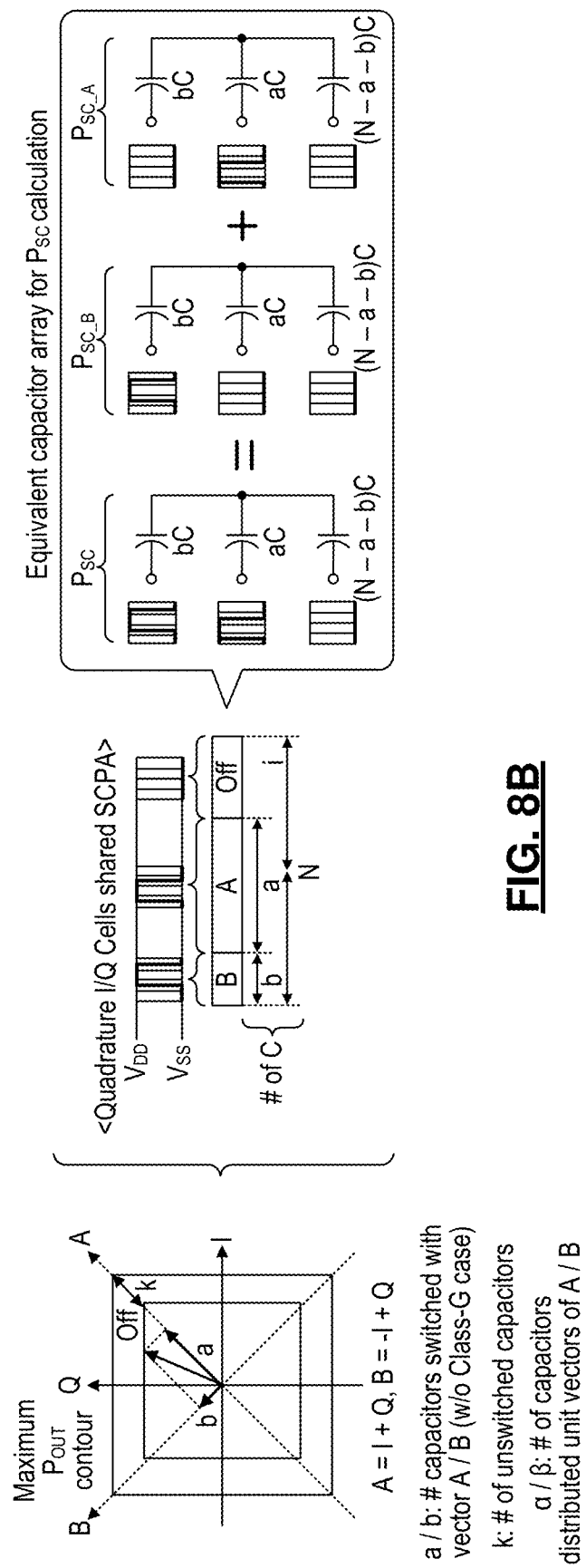
FIG. 8B is a diagrammatic view of an exemplary implementation of a quadrature IQ-Cell shared SCPA.

As shown in FIG. 8B, the quadrature IQ-Cell shared SCPA uses two orthogonal vectors as in the conventional quadrature SCPA. Therefore, the output voltage and power can be obtained in the same manner as the conventional quadrature SCPA:

$$|V_{OUT}| = \frac{2}{\pi}\sqrt{\left(\frac{a}{N}\right)^2 + \left(\frac{b}{N}\right)^2} V_{DD} \qquad (14)$$

$$P_{OUT} = \frac{1}{2}\frac{|V_{OUT}|^2}{R_{OPT}} = \frac{2}{\pi^2}\left[\left(\frac{a}{N}\right)^2 + \left(\frac{b}{N}\right)^2\right]\frac{V_{DD}^2}{R_{OPT}}. \qquad (15)$$

where a and b are the number of capacitors switched between $V_{DD}$ and $V_{SS}$, representing vectors A and B, respectively. In this architecture, since the a and b can be flexibly allocated within the total number of capacitors N, as shown FIG. 8B, the relationship among a, b, and N is given by $0 \le a+b \le N$.

The dynamic power dissipation can also be calculated using a similar method as the conventional quadrature SCPA as follows:

$$P_{SC} = P_{SC\_A} + P_{SC\_B} \qquad (16)$$

$$P_{SC\_A} = \frac{a(N-a)}{N^2}C_{TOT}V_{DD}^2 f \qquad (17)$$

$$P_{SC\_B} = \frac{b(N-b)}{N^2}C_{TOT}V_{DD}^2 f. \qquad (18)$$

Figure 9B:
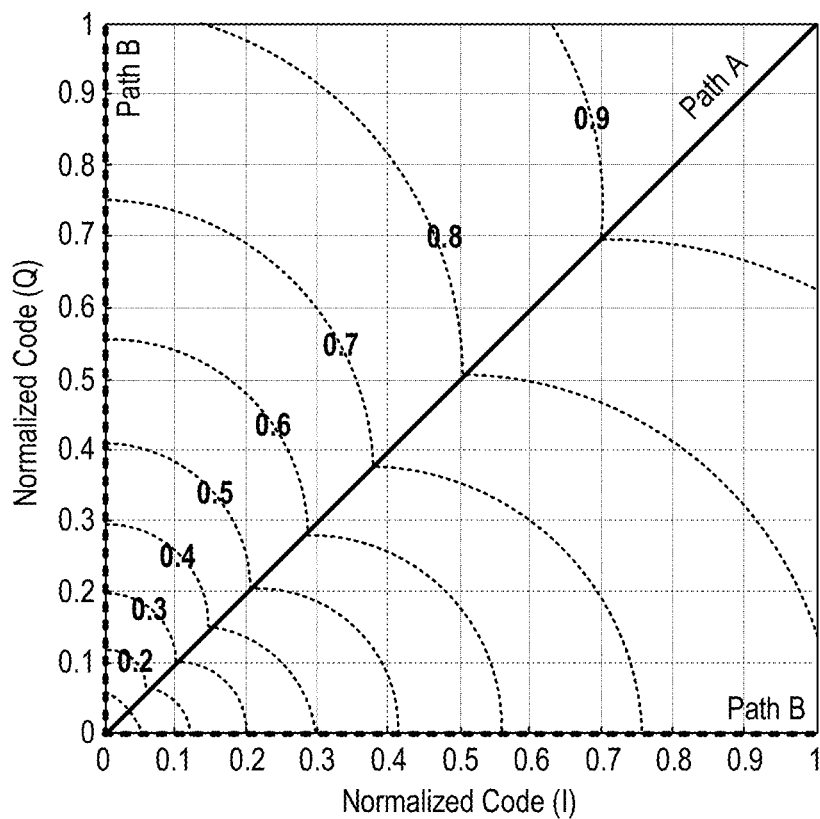
FIG. 9B is a graphical depiction showing a theoretical two-dimensional drain efficiency map for quadrant 1 when $Q_{LOAD}$ is 3 of a quadrature IQ-Cell shared SCPA of FIG. 8B.
Figure 9B:
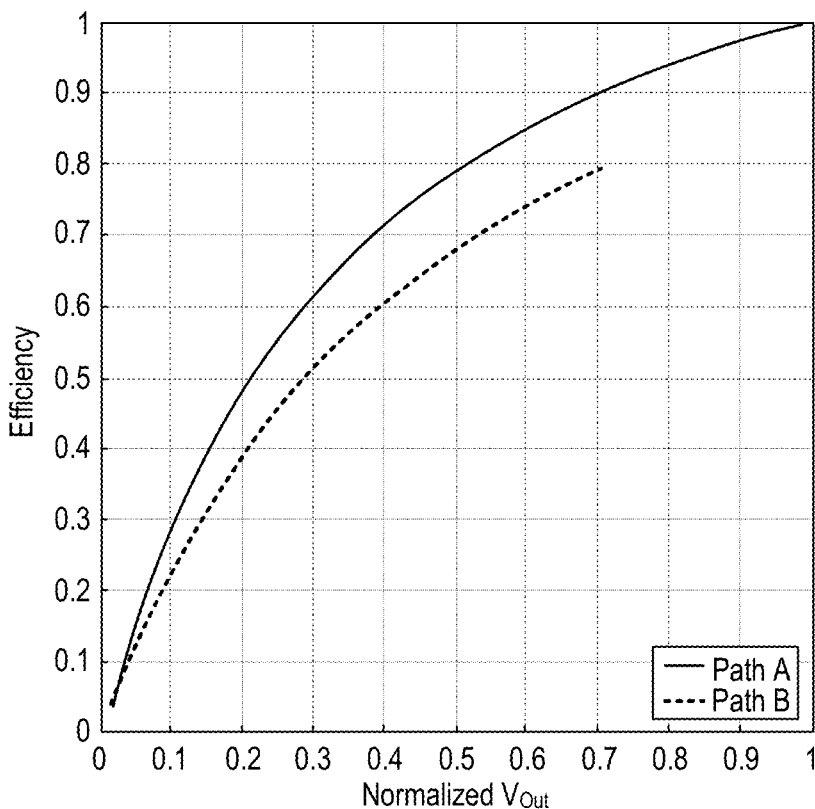

Therefore, the ideal drain efficiency can be obtained from (4) and (15)-(18). Even though the equations seem to be similar to that of the quadrature SCPA with fixed IQ cells, the IQ-combined unit vectors with flexible vector allocation lead to a different efficiency map as shown in FIG. 9B. With no dedicated, half-sized IQ cells, it shows an increased output voltage (power) and better efficiency in the PBO region.

Quadrature Class-G IQ-Cell Shared SCPA

Figure 8C:
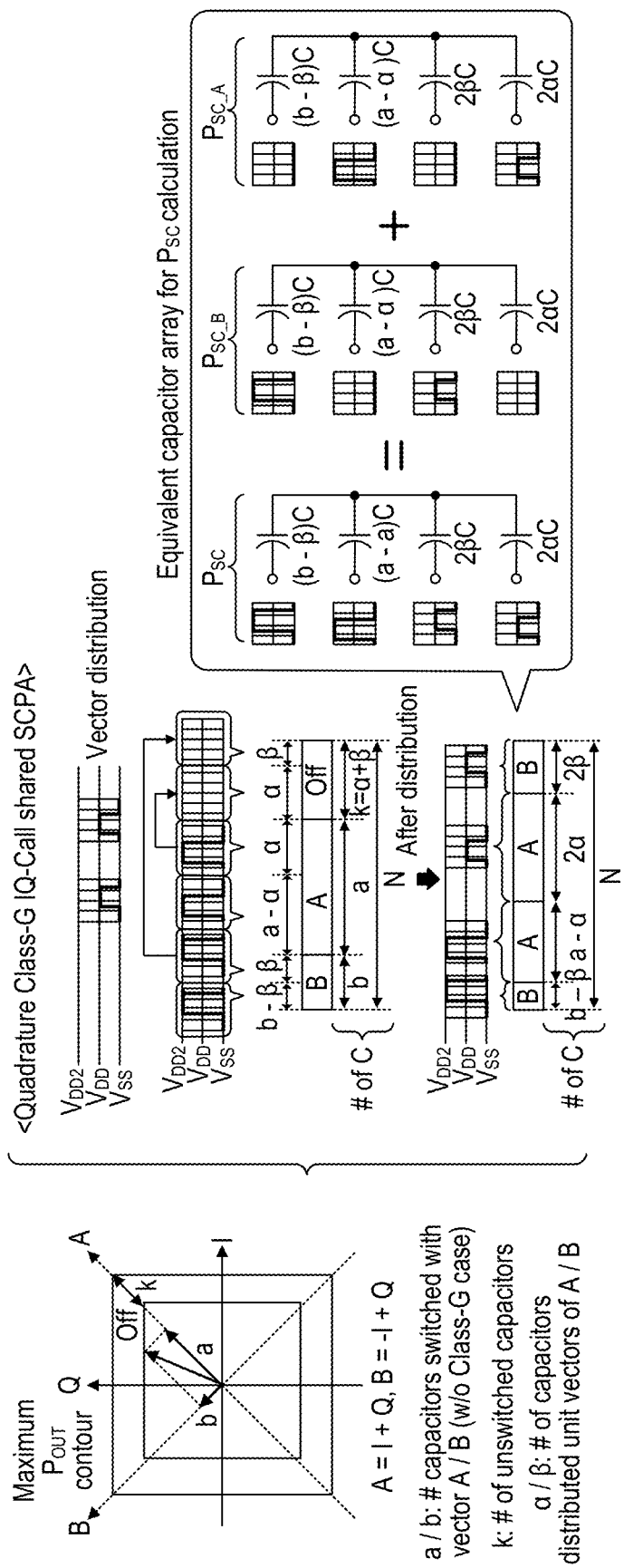
FIG. 8C is a diagrammatic view of an exemplary implementation of a quadrature Class-G IQ-Cell shared SCPA.

FIG. 8C shows Class-G operation in a quadrature IQ-Cell shared SCPA. Unlike polar SCPA and conventional quadrature SCPAs with dedicated IQ cells, the input digital code to IQ-shared cells has not only amplitude, but also phase information. As a result, the Class-G technique for a polar SCPA and for a conventional quadrature SCPA that processes only amplitude information, cannot be directly applied to the quadrature 10-Cell shared architecture.

For the enhanced-efficiency Class-G operation with an efficiency peak at 6 dB PBO in the efficiency contour in the quadrature IQ-Cell shared architecture, the output vectors with an amplitude of $V_{DD2}$ in the SCPA cell are distributed to the turned-off cells as depicted in FIG. 8C. The number of turned-on cells for vectors A and B with an amplitude of $V_{DD2}$ is defined as a and b, respectively, and turned-off cells is defined as k. The range of k is chosen as less than half of the total number of cells, N, for Class-G operation within 0-6 dB PBO region. The k is divided into two groups $\alpha$ and $\beta$ that receives the distributed vectors A and B with an amplitude of V, respectively, where $0 \le \alpha \le$, $0 \le \beta \le b$, and $\alpha + \beta = k$. After vector distribution, the amplitude of the vectors A and B are $(a-\alpha) V_{DD2} + 2\alpha V_{DD}$ and $(b-\beta)V_{DD2}+2\beta V_{DD}$, respectively, as shown in FIG. 8C.

The output voltage and power of the quadrature Class-G IQ-Cell shared SCPA can be obtained by replacing $V_{DD}$ with $V_{DD2}$ in (14) and (15) for the quadrature IQ-Cell shared SCPA:

$$|V_{OUT}| = \frac{2}{\pi}\sqrt{\left(\frac{a}{N}\right)^2 + \left(\frac{b}{N}\right)^2} V_{DD2} \qquad (19)$$

$$P_{OUT} = \frac{2}{\pi^2}\left[\left(\frac{a}{N}\right)^2 + \left(\frac{b}{N}\right)^2\right]\frac{V_{DD2}^2}{R_{OPT}}. \qquad (20)$$

In the region deeper than 6 dB PBO, the operation is similar to the quadrature IQ-Cell shared SCPA without Class-G, because all the vectors with an amplitude of $V_{DD2}$ have been distributed and only the vectors with an amplitude of $V_{DD}$ remain. The ideal drain efficiency can be obtained from similar equations.

For computing the ideal drain efficiency in the 0-6 dB PBO region, the dynamic power dissipation of the Class-G operating cells for the vectors A and B needs to be analyzed. In FIG. 8C, the equivalent capacitor arrays of the SCPA and their input voltages are shown to calculate the dynamic power dissipation. The dynamic power dissipation cannot be derived directly with $C_{IN}$ because the capacitor network has three ports with different potentials. For this reason, dynamic power dissipation for each capacitor switched between $V_{DD2}$ and $V_{SS}$, $V_{DD}$ and $V_{SS}$, and unswitched can be calculated separately as follows:

$$P_{SC\_A} = P_{SC\_A1} + P_{SC\_A2} + P_{SC\_A3} \qquad (21)$$

$$P_{SC\_B} = P_{SC\_B1} + P_{SC\_B2} + P_{SC\_B3}. \qquad (22)$$

where $P_{SC\_A1}(P_{SC\_B1})$, $P_{SC\_A2}(P_{SC\_B2})$, and $P_{SC\_A3}(P_{SC\_B3})$ are the powers dissipated to charge/discharge the capacitors switched between $V_{DD2}$ and $V_{SS}$, $V_{DD}$ and $V_{SS}$, and unswitched, respectively.

Figure 9C:
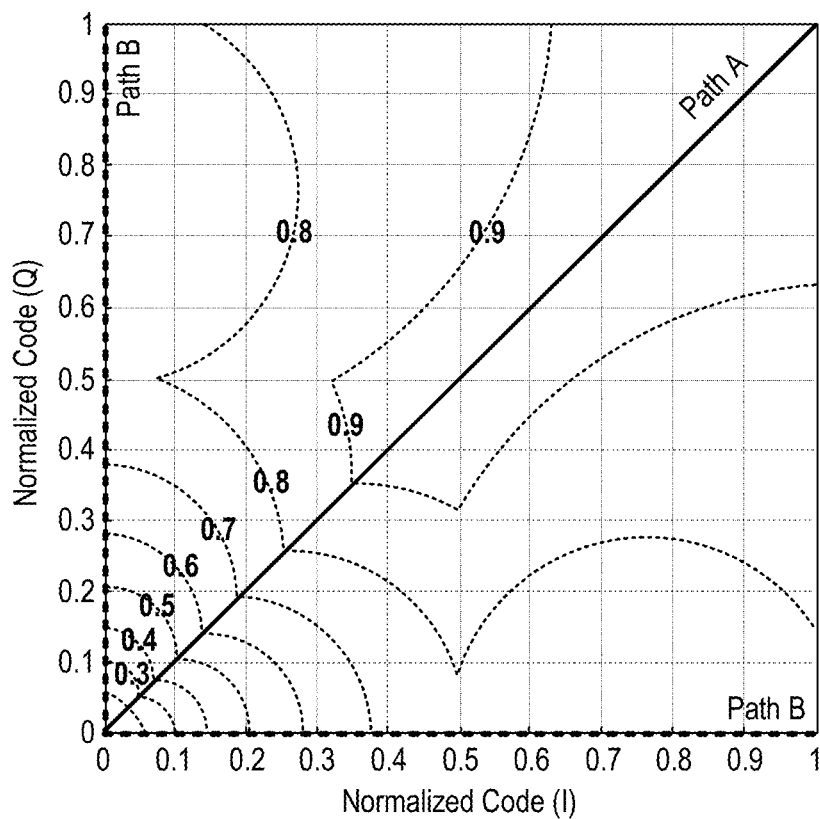
FIG. 9C is a graphical depiction showing a theoretical two-dimensional drain efficiency map for quadrant 1 when $Q_{LOAD}$ is 3 of a quadrature Class-G IQ-Cell shared SCPA of FIG. 8C.
Figure 9C:
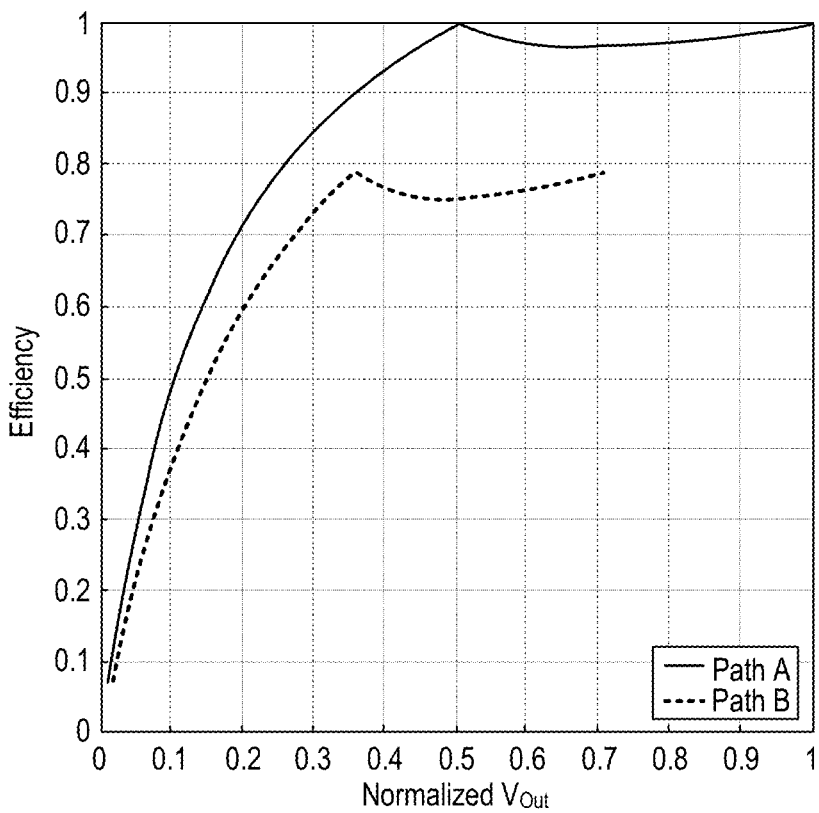

The total dynamic power dissipation is given by:

$$P_{SC} = P_{SC\_A} + P_{SC\_B} \qquad (23)$$

$$P_{SC_A} = \qquad (24)$$
$$\left[\frac{4(a-\alpha)}{N}\left(\frac{N-a}{N}\right)^2 + \frac{2a}{N}\left(\frac{N-2a}{N}\right)^2 + \frac{b+\beta}{N}\left(\frac{2a}{N}\right)^2\right]C_{TOT}V_{DD}^2 f$$

$$P_{SC_B} = \qquad (25)$$
$$\left[\frac{4(b-\beta)}{N}\left(\frac{N-b}{N}\right)^2 + \frac{2\beta}{N}\left(\frac{N-2b}{N}\right)^2 + \frac{a+\alpha}{N}\left(\frac{2b}{N}\right)^2\right]C_{TOT}V_{DD}^2 f.$$

where $0 \leq \alpha \leq a$ and $0 \leq \beta \leq b$ and $N=a+b+\alpha+\beta$. The ideal drain efficiency is obtained from (4) and (20)-(25), as illustrated in FIG. 9C.

Merged Cell Switching Technique for Quadrature Class-G IQ-Cell Shared SCPA

In contrast to the conventional dual-supply Class-G SCPAs that process one-dimensional amplitude information in a polar architecture or a quadrature architecture with dedicated IQ cells, the Class-G technique cannot be directly applied to the IQ-Cell shared architecture because various vectors of different amplitude and phase need to be processed in a single SCPA cell. High average drain efficiency is achieved with an additional efficiency peak associated with Class-G operation. Furthermore, power dissipation in the digital logic circuits operating at radio frequency (RF) such as the digital mixer, level shifter, and control blocks can be reduced by half, which leads to an improved system efficiency (SE) as well.

Proposed Merged SCPA Cell

Figure 10C:
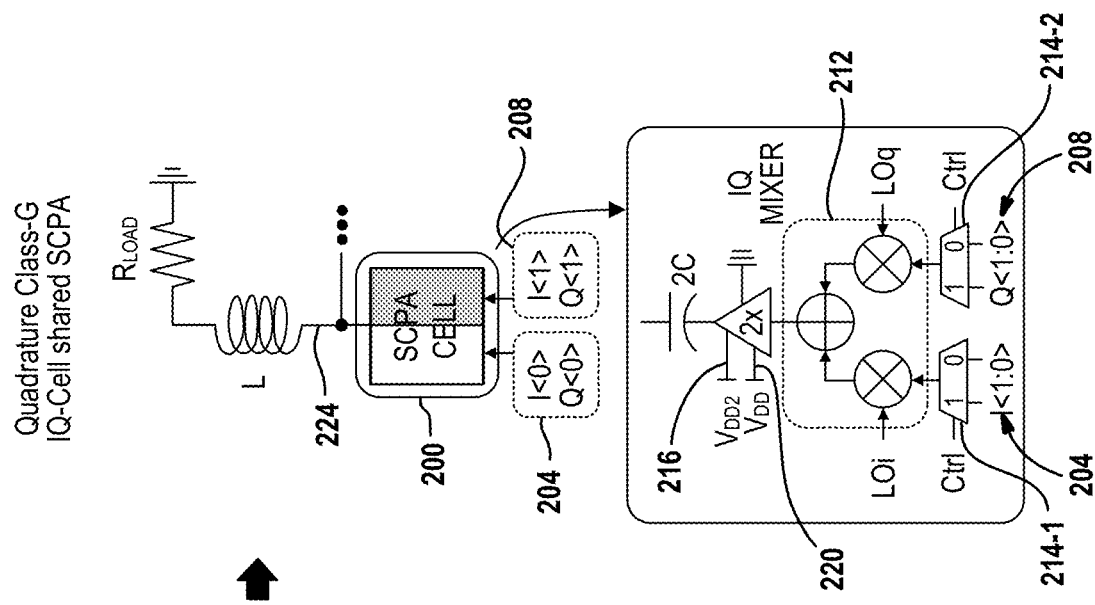
FIG. 10C is an exemplary schematic of quadrature SCPA cells with two thermometer codes using one merged type A cell for quadrature dual supply Class-G IQ-Cell shared SCPA.
Figure 10B:
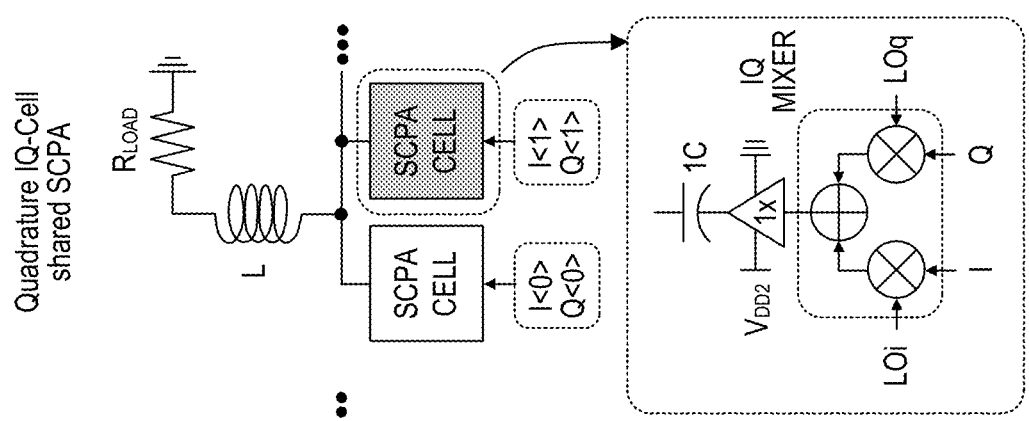
FIG. 10B is an exemplary schematic of quadrature SCPA cells with two thermometer codes using two cells of quadrature IQ-Cell shared SCPA.
Figure 10A:
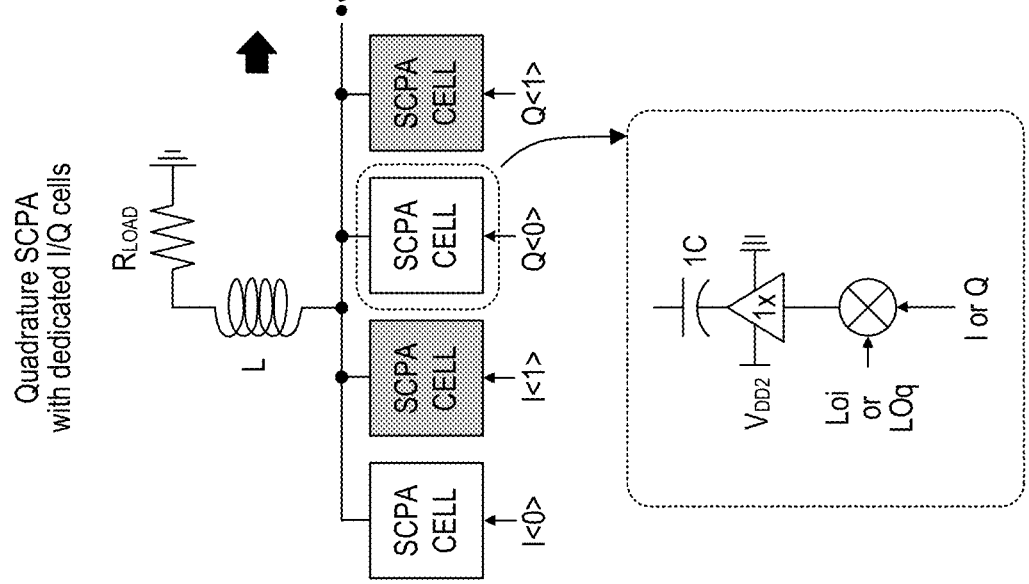
FIG. 10A is an exemplary schematic of quadrature SCPA cells with two thermometer codes using four cells of quadrature SCPA with dedicated IQ cells.

To achieve a reduced chip area and an enhanced drain efficiency associated with the efficient Class-G operation in quadrature architecture, four conventional quadrature SCPA cells, shown in FIG. 10A, are merged into two cells by adopting IQ-Cell shared architecture as shown in FIG. 10B, and then the two cells are further merged into a single cell that operates with a dual-supply voltage as shown in FIG. 10C. After the cells are merged, a Class-G operation is performed with the MCS technique described below. The merged cell for Class-G operation in FIG. 10C processes two input IQ data sets, [I<0>, Q<0>] and [I<1>, Q<1>]. FIG. 10C depicts an example merged SCPA cell 200 including two inputs: a first input vector 204 having an input data set of [I<0>, Q<0>] and a second input vector 208 having an input data set of [I<1>, Q<1>]. As will be more fully described below in an embodiment shown in FIG. 11B using four SCPA cells, the merged cell switching technique may be used with a plurality of SCPA cells.

Figure 11A:
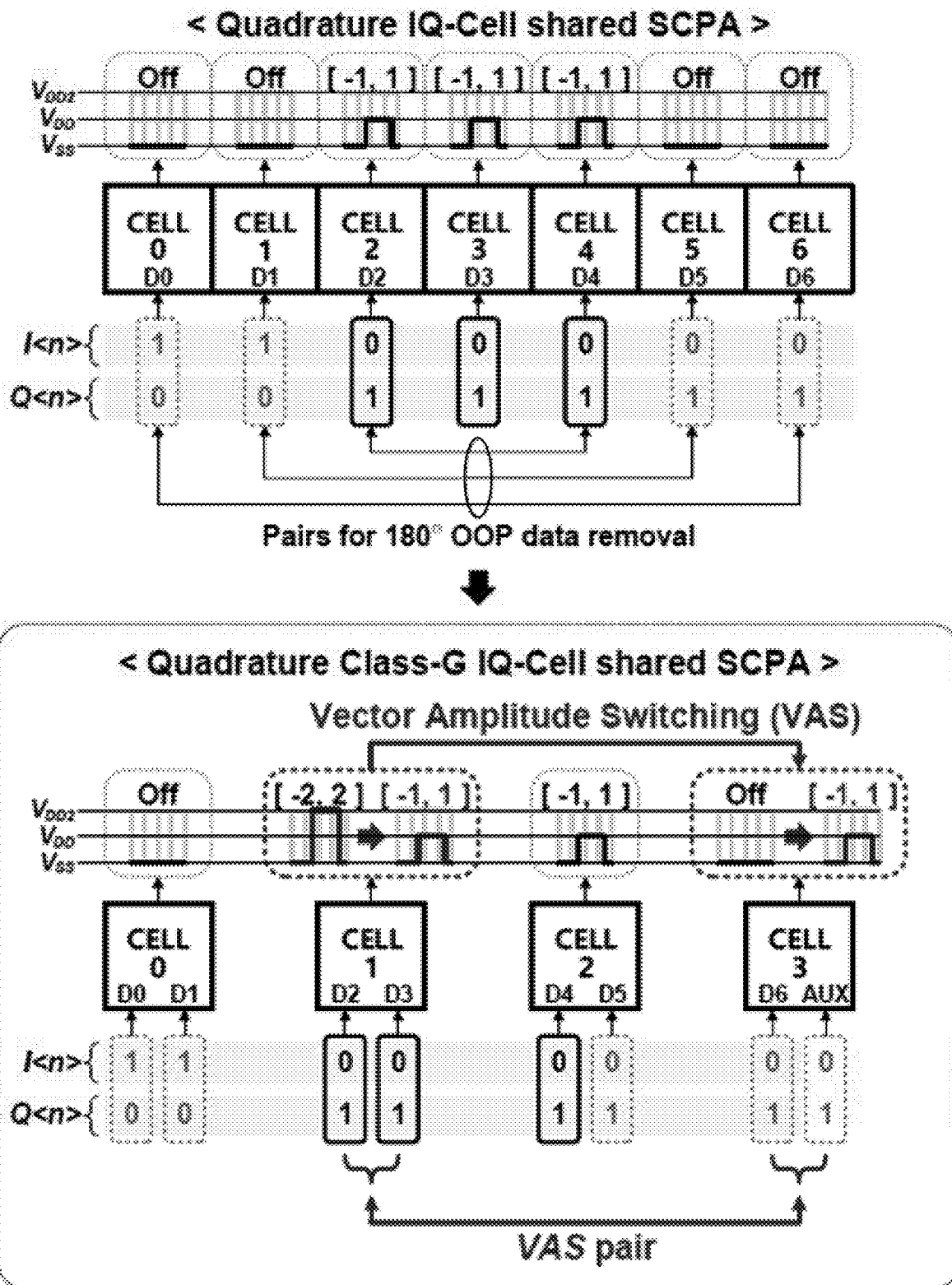
FIG. 11A is a diagrammatic view showing an exemplary implementation of vectoring amplitude switching (VAS) operation of a merged cell switching (MCS) technique.
Figure 11B:
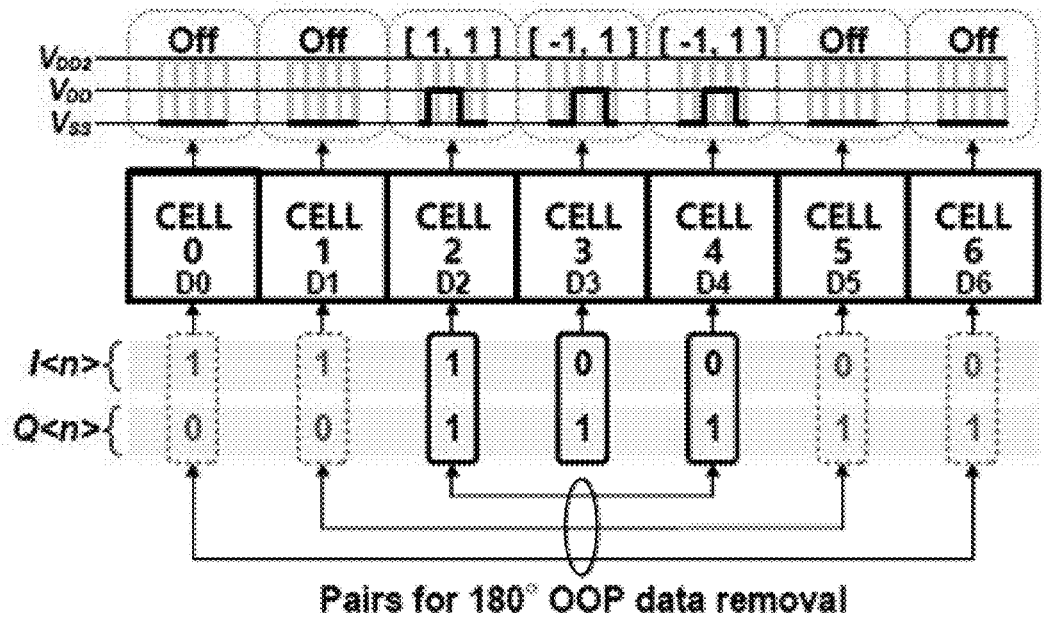
FIG. 11B is a diagrammatic view showing an exemplary implementation of vectoring phase switching (VPS) operation of an MCS technique.
Figure 11B:
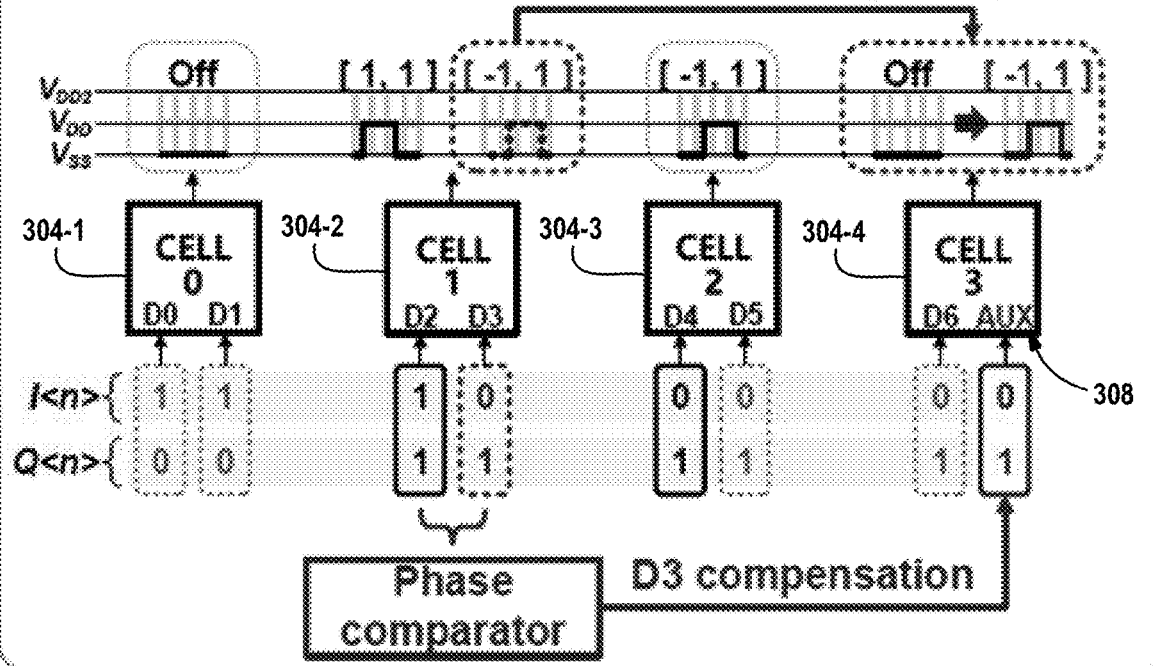

In order to process all data sets provided in the first input vector 204 and the second vector 208, the SCPA cell 200 may also include an auxiliary input port, as shown in FIG. 11B, for processing unselected data. Since each SCPA cell has just one digital mixer 212 that processes a single IQ-combined unit vector, it cannot process the two IQ data sets at the same time. Accordingly, multiplexers 214-1, 214-2 select only one IQ data set out of the two using a selection signal that comes from the control logic in each SCPA cell. The merged SCPA cell 200 follows certain operation parameters in order to process all input data provided by the IQ data sets of the first input vector 204 and the second vector 208 as well as to be applicable to high voltage, where a high voltage 216 has an amplitude of $V_{DD2}$, and low voltage applications, where a low voltage 220 has an amplitude of $V_{DD}$.

For example, if the two IQ data sets are the same, an output 224 of the merged SCPA cell delivers the signal with an amplitude of $V_{DD2}$ regardless of the multiplexer selection signal. However, in the low voltage 220 application, the signals may be split, as described below, and modulated at the amplitude of $V_{DD}$. Otherwise, if the first input vector 204 and the second vector 208 that the multiplexers 214-1, 214-2 receive are different, the multiplexers 214-1, 214-2 select one or the other based on the code selection signal discussed in the following section that implements the merged cell switching technique. For example, when the first input vector 204 and the second input vector 208 are different, the SCPA cell 200 may be configured to automatically select the first input vector 204 and modulate the first input vector 204 at the amplitude of $V_{DD}$. Then, for the system to process both the first input vector 204 and the second input vector 208, the SCPA cell 200 distributes the unselected vector (in this case, the second input vector 208) to an auxiliary port of an auxiliary cell to be modulated with a signal of amplitude $V_{DD}$, which may be implemented next to the SCPA cell 200.

Figure 10D:
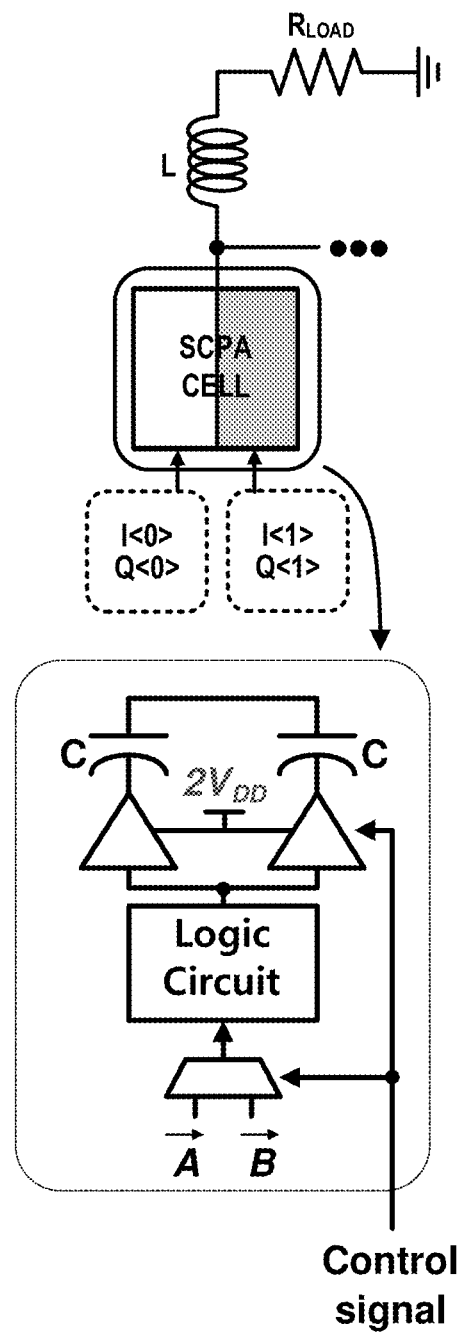
FIG. 10D is an exemplary schematic of quadrature SCPA cells with two thermometer codes using one merged type B cell for quadrature dual supply Class-G IQ-Cell shared SCPA.

The SCPA cell 200 may include a first cell type on the left in white, for example, type A, and a second cell type on the right in grey, for example, type B. The MCS enables power and area efficient SCPA operation by merging two cells into one as shown in FIGS. 10C and 10D. Both merged cell types, type A in FIG. 10C and type B in FIG. 10C, can accommodate the MCS operation. The type A has a Class-G switch with dual-supply voltage ($V_{DD2}$ and $V_{DD}$) and the type B has two conventional (Class-D) switches with single supply voltage ($V_{DD}$). Even though the type B cannot improve drain efficiency of SCPA due to capacitor dividing for representing output voltage of $V_{DD2}$ and $V_{DD}$, it can enhance power added efficiency and reduce area of the SCPA by paring two SCPA cells and sharing logic circuits.

Since each unit SCPA cell just has one logic circuit comprising a digital mixer that can process a single vector, it cannot process the two vectors at the same time. Accordingly, multiplexer selects only one vector out of the two using a control signal that comes from the control logic in each SCPA cell. The basic operation of the merged cell type A (type B) is as follows: (1) If the two vectors are identical, the multiplexer selects any one of them and the control signal activates $V_{DD2}$ output switch (both output switches). (2) If the two vectors are different or one of them is disabled, the control signal only selects either one of them or the enabled one and activates $V_{DD}$ output switch (deactivates one of the two output switches). (3) If both input unit vectors of the SCPA cell are disabled, the cell turns off and does not transmit any output.

Therefore, type A operation may include, when the SCPA cell 200 is disabled, then no output signal is present. In type A, if the first input vector 204 and the second input vector 208 are different, one of the first input vector 204 or the second input vector 208 are output with an amplitude of $V_{DD}$. Otherwise, in type A, if the first input vector 204 and the second input vector 208 are the same, both vectors 204 and 208 are output with and amplitude of $V_{DD2}$.

For the type B SCPA cell of FIG. 10D (and as similarly described with respect to FIG. 10C) if the first input vector 204 and the second input vector 208 are disabled, the SCPA cell turns off. If the first input vector 204 and the second input vector 208 are different, the SCPA cell outputs the first input vector 204 or the second input vector 208 with an amplitude of $V_{DD}$, using only one of the conventional Class-D switches. Otherwise, in type B, if the first input vector 204 and the second input vector 208 are the same, both vectors 204 and 208 are output with and amplitude of $V_{DD2}$, using both of the conventional Class-D switches.

This idea is for the Class-G operation in DPA (or RF DAC) whose SCPA cell has multiple input vectors provides a single output (merged cell). Among the multiple input vectors, only one kind of phase information can be processed in a single sub-DPA cell because it has a single mixer. The remaining input vectors with multiple different phase information should be distributed (switched) to other cells and conserved. If all the input vectors for the SCPA cell are the same, the cell operates at the maximum voltage (power) or distributes its phase information and part of its amplitude information to the cell which has no input vector.

As shown in FIGS. 11A and 11B, multiple merged SCPA cells 304-1, 304-2, and 304-3 may be implemented using tis distribution technique and when one of the cells 304-1, 304-2, and 304-3 is processing two vectors with different data that cell will distribute the unselected data to an auxiliary port 308 of a designated auxiliary cell or, as shown, in another cell 304-4. Additionally, if the two IQ data sets of the SCPA cell 200 are deactivated, the switch is not switched and connected to signal ground.

Merged Cell Switching Operation

The merged cell switching (MCS) technique, comprised of the vector amplitude switching (VAS) and vector phase switching (VPS) techniques as shown in FIGS. 11A-C, is implemented on chip along with other digital control logic gates. The "merged cell" can have multiple input vectors because it aggregates several unit cells with different input vectors and merges the different input vectors into one single cell. However, as described previously, single cell can process only one phase (vector) information because it has a single mixer. In order to process all the vectors at the same time without any loss of information, the remaining vectors should be distributed to other cells and conserved. In this patent, the distribution of the vector implies vector "switching." The MCS technique enables an enhanced-efficiency Class-G operation in the quadrature 10-Cell shared SCPA architecture. The VAS enables the vector distribution introduced previously, and the VPS conserves the amplitude and phase information when the cells are merged.

First, the SCPA cell is turned off by the 180° out-of-phase (OOP) data removal operation in the IQ-shared cells. The pairs of IQ data sets that are deactivated are as follows: [1, 0], [0, 1] or [1, 1], [0, 0]. Examples of the 180° OOP operation are shown in the pairs of gray dashed rectangles in FIGS. 9A-9C.

The VAS operation is described in FIG. 11A. If the two input IQ data sets of the SCPA cell are the same and its VAS paired cell is turned off, the VAS operation splits a vector with an amplitude of $V_{DD2}$ into two smaller vectors with an amplitude of $V_{DD}$, distributing half of the vector from the fully turned-on ($V_{DD2}$) cell to the paired turned-off (Off) cell. This operation keeps the same output voltage at the top plate of the capacitors after the vector distribution. In this way, the SCPA may be used in a high voltage applications, using the amplitude of $V_{DD2}$ to transmit both data sets. The SCPA cell may also be implemented in low voltage applications. That is, as described, the vector may be split into two smaller vectors with the amplitude of $V_{DD}$.

The VPS operation is presented in FIG. 11B. It maintains the vector information when one of the SCPA cells has two different input IQ data sets. Each SCPA cell can process only one IQ data set because it has only one IQ mixer and the unselected data needs to be compensated. The unselected data is transferred to the cell with an auxiliary (AUX) input that processes the extra IQ data set. The AUX input is controlled by the digital phase comparator which detects the difference between the two IQ data sets. If the two data sets to a SCPA cell are different, it activates the AUX input to compensate for the unselected data.

The detailed SCPA operation with both VAS and VPS is directly related to the merged SCPA cell described above and is as described as follows. If the two input IQ data sets are the same, the SCPA cell outputs a square-wave signal of amplitude $V_{DD2}$ modulated with the IQ data set. Otherwise, it distributes one of the two data sets to the VAS-paired cell which is off. In this case, both operate with $V_{DD}$ for better drain efficiency. If one of the two input IQ data sets is canceled by the 180° OOP data removal, the SCPA cell delivers a signal of amplitude $V_{DD}$ modulated with the remaining IQ data set. If both IQ data sets are deactivated by the 180° OOP data removal operation, the SCPA cell remains off and connected to a signal ground, since there is no IQ data set to be distributed from the paired cell in the deep PBO region. In the case of 0-6 dB PBO, the SCPA cell outputs the distributed signal with an amplitude of $V_{DD}$ from its VAS-paired cell. If the two IQ data sets are not the same, only one of them is selected in the SCPA cell to generate a modulated signal of amplitude $V_{DD}$, and the unselected IQ data set is distributed to the cell with the AUX input through the VPS operation.

Linearization Techniques for Class-G SCPA

As discussed above, the enhanced-efficiency Class-G SCPA has a great advantage in improving the drain efficiency. Class-G with multiple supply voltages in SCPA is more linear than in the conventional Class-G PAs because the abrupt switching does produce glitches. The power domain change is made very smoothly and seamlessly in SCPA because i) the voltage domain changes when the switches are disabled and is not connected to any supply voltage and ii) the voltage does not change abruptly for the entire power amplifier, but rather changes in a continuous manner while using both supply voltages simultaneously for enhanced efficiency and linearity. However, the multiple supply voltages still result in signal distortion due to the mismatches in the supply voltages and different signal paths, necessitating compensation with predistortion. The linearization techniques for the amplitude and phase improve the linearity and minimize the requirement of DPD. As described, the above linearization technique may be applied to a Class-G switch that does not implement or is not controlled according to the MCS control technique described within the present disclosure. That is, the linearization technique can be performed for a Class-G switch independent of the MCS control technique.

Supply Voltage Mismatch Insensitive Class-G SCPA

Figure 12A:
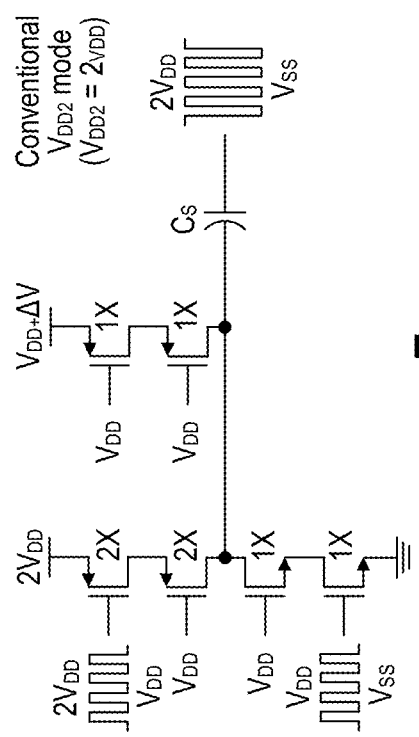
FIGS. 12A-B is an exemplary schematic showing switch cells for Class-G dual supply voltage SCPA of a conventional switch to a switch cell for amplitude mismatch compensation in $V_{DD2}$ mode and in $V_{DD}$ mode.
Figure 12A:
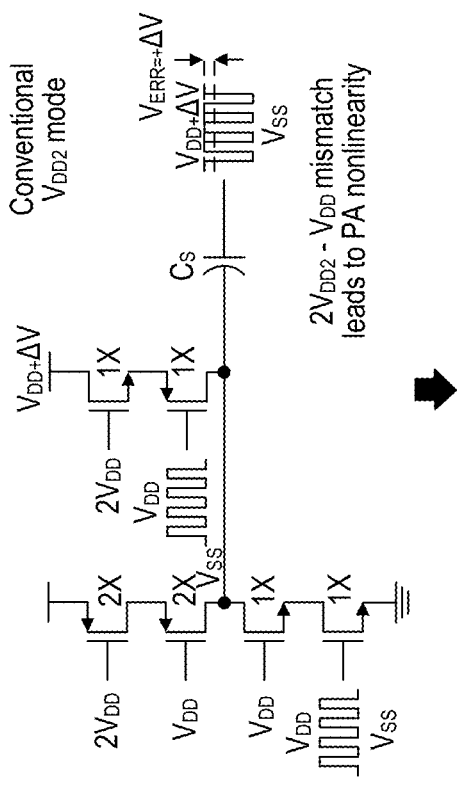
Figure 12B:
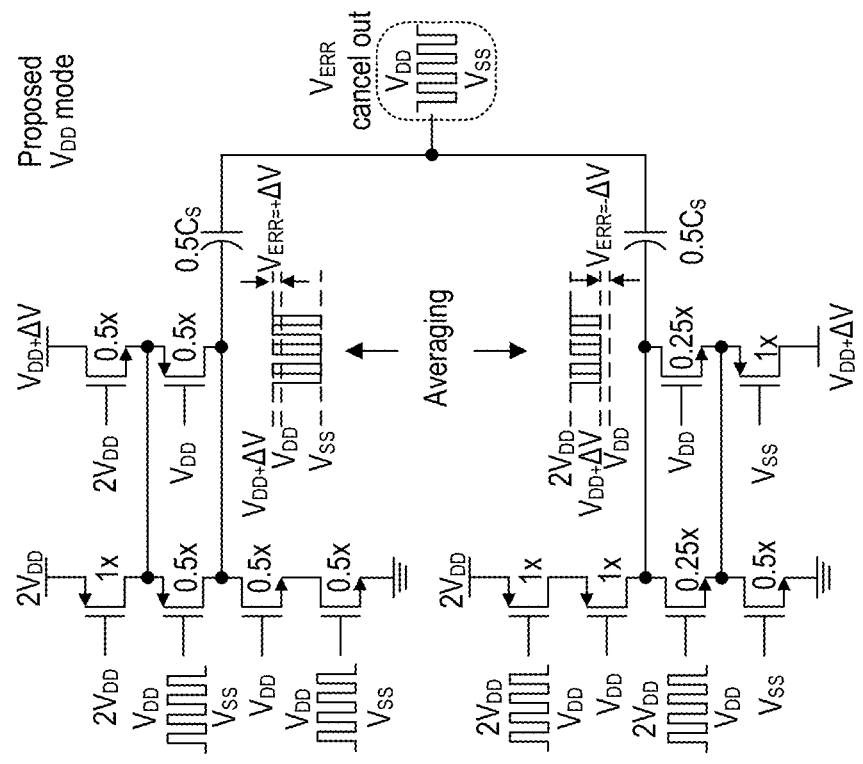
Figure 12B:
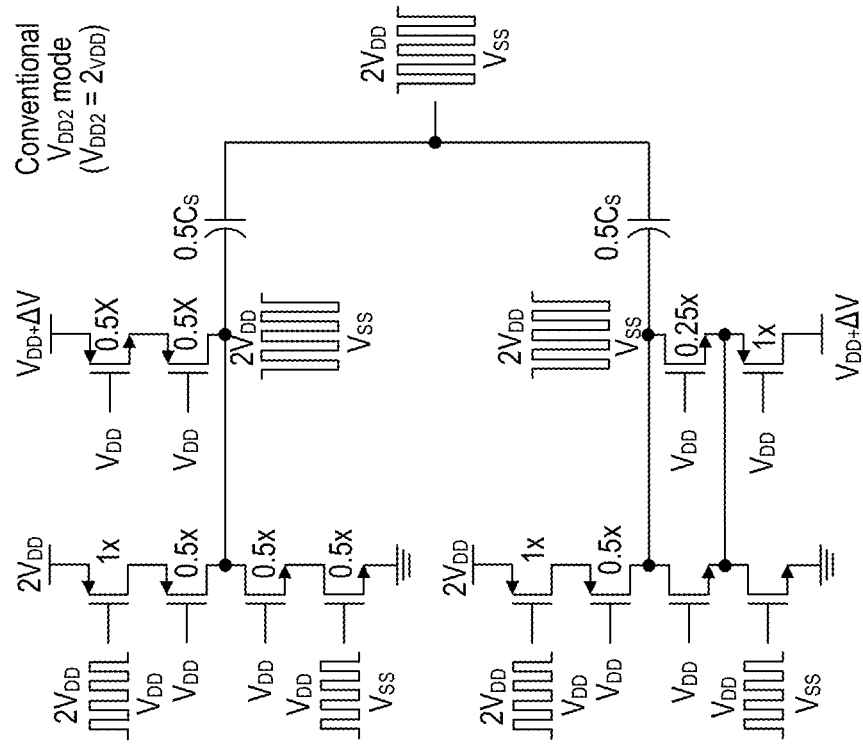

FIGS. 12A-B shows a conventional switch for a dual-supply Class-G SCPA and the proposed switch which is insensitive to the supply voltage mismatch. In the figure, the matching network for the output stage is not shown. The Class-G switches employ the two different voltages, $V_{DD2}$ and $V_{DD}$, to generate an output voltage for large/small output power. In the conventional switch in FIG. 12A, $V_{DD2}$ should be equal to $2 \times V_{DD}$ to generate an accurate output voltage. However, the value of $V_{DD}$ is not always one half of $V_{DD2}$ and can differ due to PVT variation. Any mismatch generates nonlinearity and should be corrected with DPD. Even after DPD, it is still susceptible to any dynamic change if there are uncorrelated changes or glitches in both voltages during actual operation. The amplitude of the distorted output voltage in the $V_{DD}$ mode for low power, shown in FIG. 12A, can be expressed as follows:

$$|V_{OUT}| = V_{DD} + \Delta V - V_{SS} \quad (26)$$

where $\Delta V$ is the mismatch between the two supply voltages. The proposed switch for Class-G SCPA depicted in FIG. 12B, however, is very robust to any supply voltage mismatch. It takes the average of $V_{DD2}-V_{DD}$ and $V_{DD}-V_S$ to generate $V_{DD2}/2$ instead of $V_{DD}$ in the low power mode ($V_{DD}$ mode). It splits a conventional Class-G switch cell into two half-sized cells that operate between $V_{DD}-V_{SS}$ and $V_{DD2}-V_{DD}$, and shares the outputs at the capacitor top plates through capacitor combining using a half-sized capacitor (CS). The mismatch voltage can be canceled out at the summing node at the top plate of the capacitors. The amplitude of the linearized output voltage in the $V_{DD}$ mode can be expressed as follows:

$$|V_{OUT}| = \frac{(V_{DD2} - V_{DD} - \Delta V) + (V_{DD} + \Delta V - V_{SS})}{2} \quad (27)$$

$$= \frac{V_{DD2} - V_{SS}}{2} = V_{DD} - V_{SS}.$$

Figure 15A:
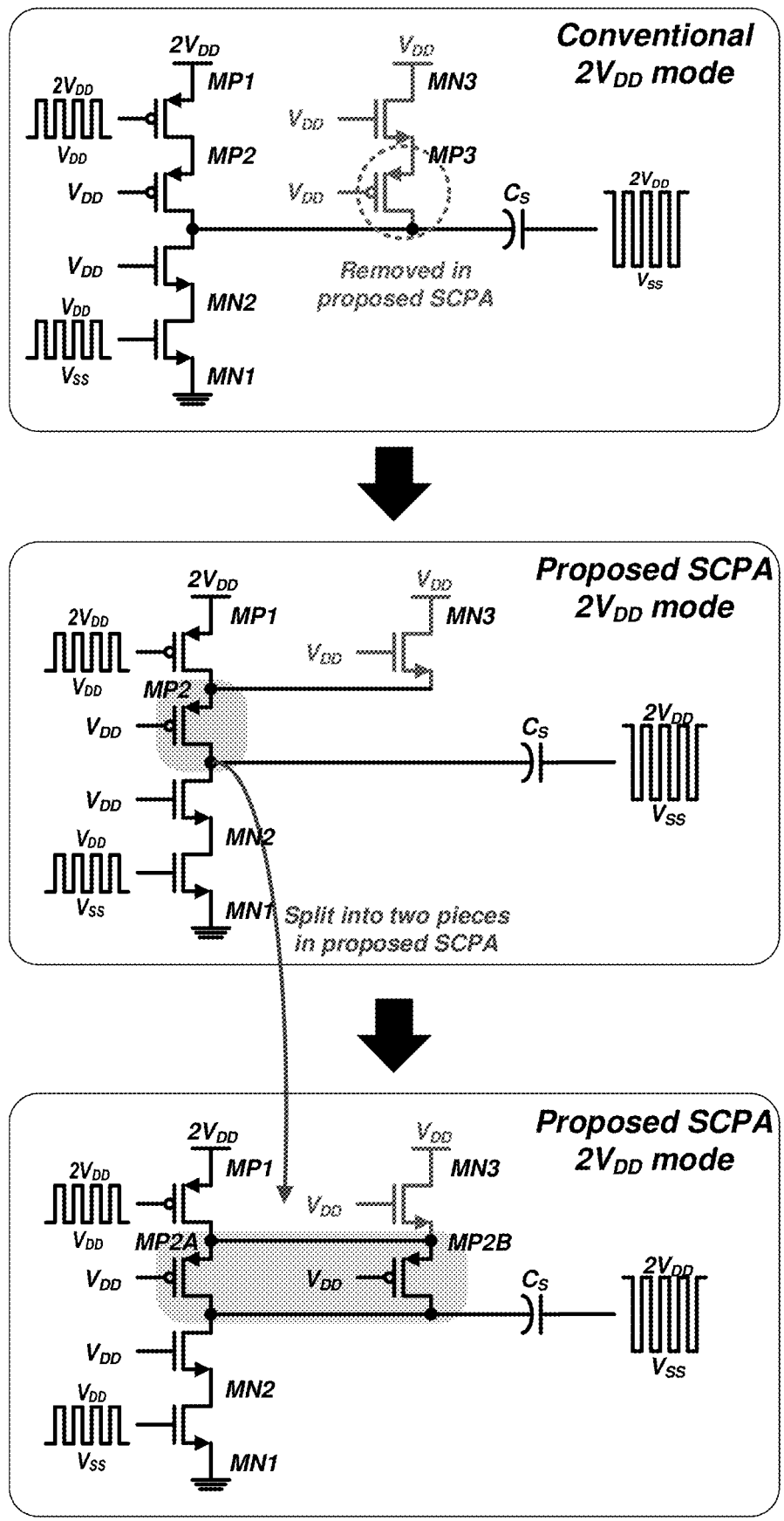
FIG. 15A is an exemplary schematic showing an area- and power-efficient switch for Class-G SCPA in $V_{DD2}$ mode.
Figure 15B:
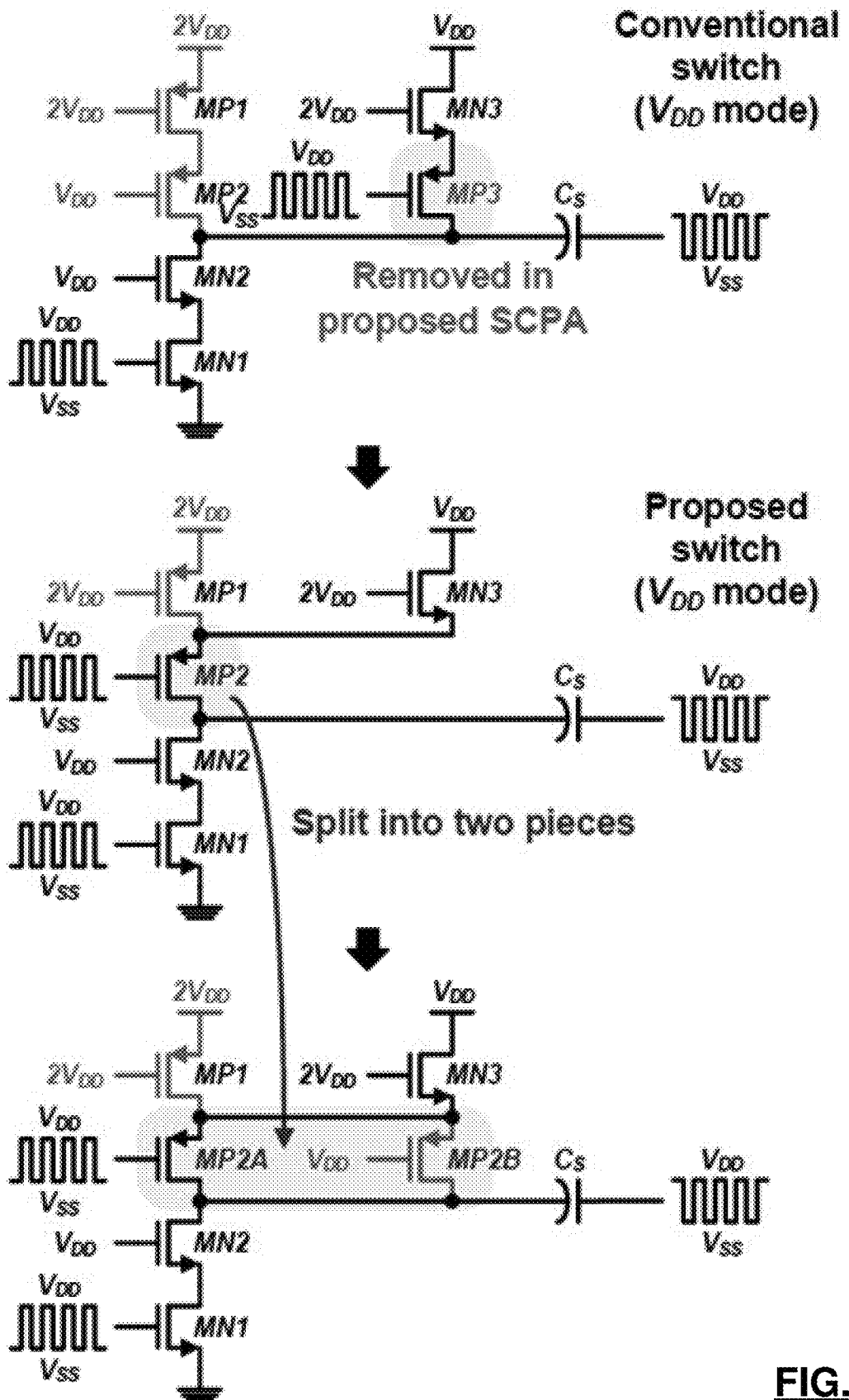
FIG. 15B is an exemplary schematic showing an area- and power-efficient switch for Class-G SCPA in $V_{DD}$ mode.

The reduction of the dynamic power consumption in the output switches and switch drivers is essential to improve the efficiency of the SCPA. The dynamic power is dissipated to charge and discharge the capacitor array and parasitic capacitance at the transistor switch itself. The power consumption to charge/discharge the capacitor array can be reduced by using the Class-G technique or using small capacitors as discussed above. However, due to the additional transistors for Class-G operation, the drain efficiency improvement can be compromised, especially in the deep PBO region. To maximize the efficiency improvement, an area- and power-efficient switch for Class-G SCPA in $V_{DD}$ mode is proposed as shown in FIGS. 15A-B.

Figure 13A:
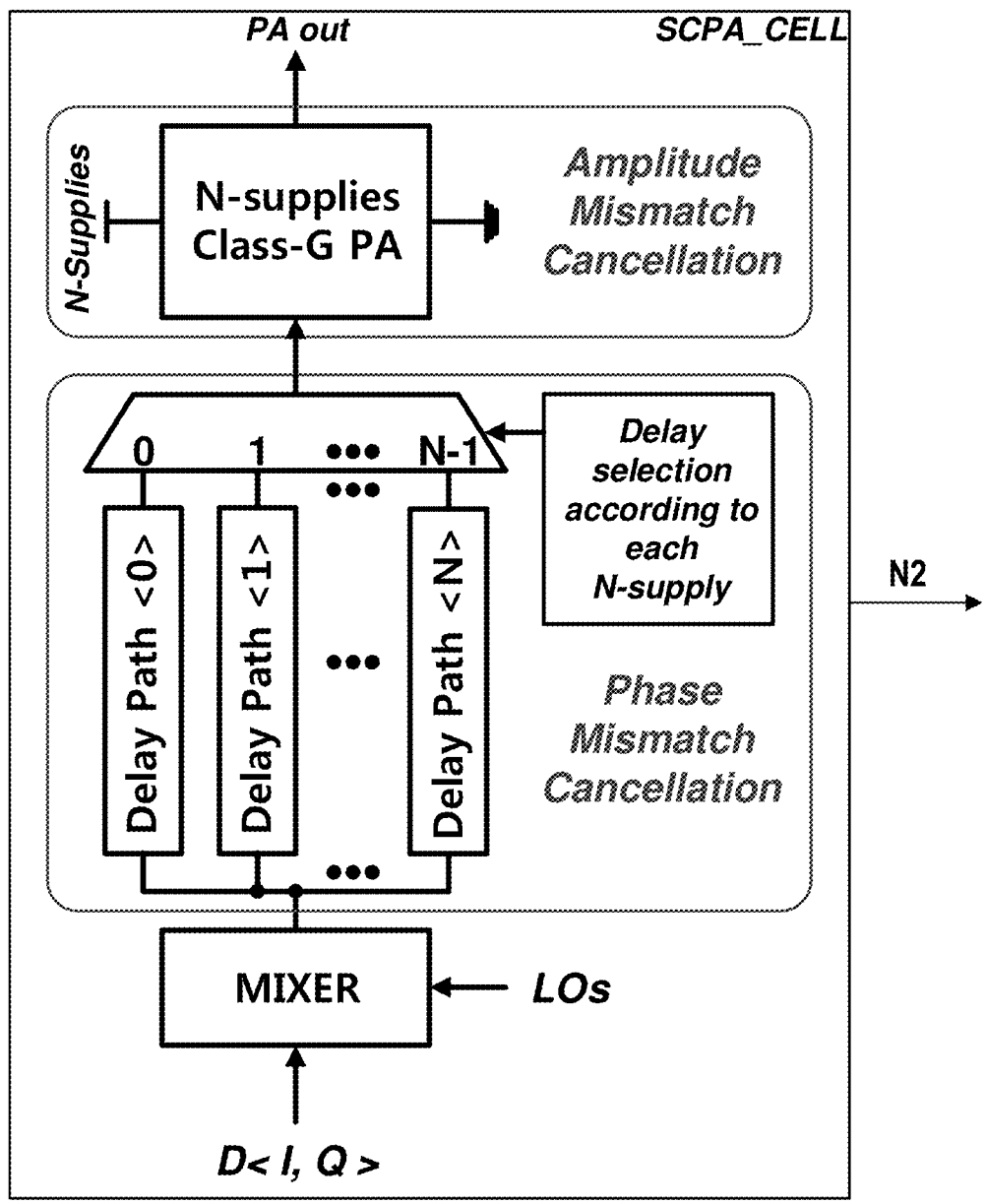
FIG. 13A is an exemplary embodiment of a functional block diagram providing amplitude mismatch cancellation and phase mismatch cancellation.
Figure 13B:
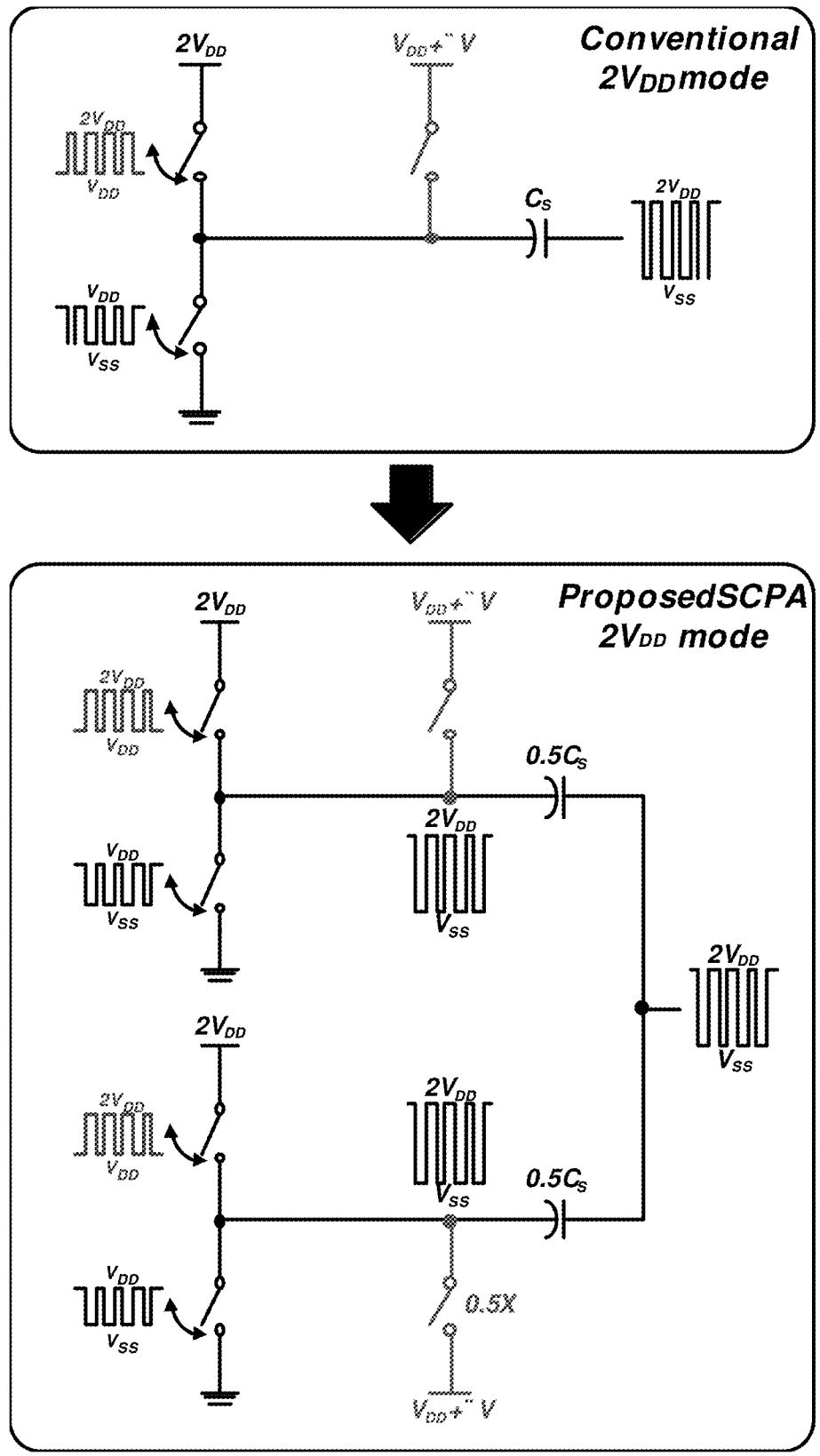
FIGS. 13B-C are exemplary schematics showing conventional $V_{DD2}$ and $V_{DD}$ mode as well as $V_{DD2}$ and $V_{DD}$ mode in the proposed SCPA.
Figure 13C:
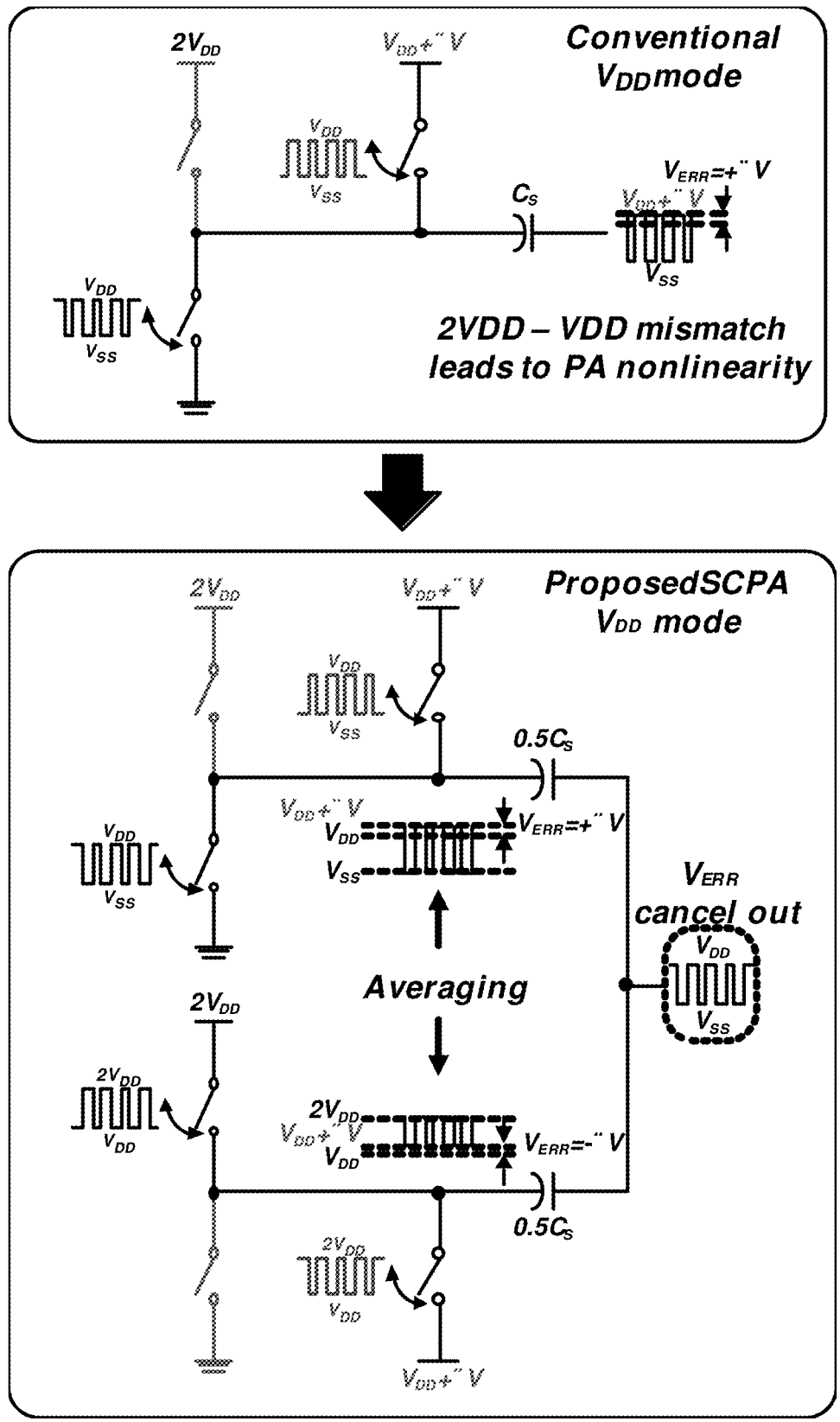

FIG. 13A depicts a generalized case of a functional block diagram providing amplitude mismatch cancellation and phase mismatch cancellation. FIGS. 13B-C depict conventional $V_{DD2}$ and $V_{DD}$ mode as well as $V_{DD2}$ and $V_{DD}$ mode in the proposed SCPA, for example, the SCPA 200 of FIG. 10C. The proposed circuit implements switches to cancel out amplitude mismatch when two voltages are used.

For class-G with dual-supply voltages, mismatch between supply voltages could easily create nonlinearities because the ratio of $V_{DD2}$ and $V_{DD}$ is not always ideal. It can also be vulnerable to process, voltage, and temperature (PVT) variations. Even if the example of FIGS. 13B-C is for dual supply voltages, it can be extended to multiple supply voltages of more than two voltages. In various implementations, the combination of operating switches varies.

In order to achieve a good linearity, the average of the $V_{DD2}-V_{DD}$ and $V_{DD2}-GND$ (or $V_{SS}$) is used for generating exact half of the $V_{DD2}$ by splitting the conventional class-G switch structure into two pieces and sharing their outputs at the capacitor top plates. For example, if there is an offset voltage of $\Delta V$ for $V_{DD}$, the $\Delta V$ directly affects the output linearity in the conventional class-G SCPA. For the proposed class-G switch cell, on the other hand, $\Delta V$ can be eliminated at the summing node and the output as follows: $[(V_{DD2}-V_{DD}-\Delta V)+(V_{DD}+\Delta V-GND)]/2=V_{DD}$. In addition to the amplitude mismatch cancellation, two separate phase paths for $V_{DD}$ and $V_{DD2}$ are also compensated with the delay mismatch control. Delay compensation circuit could include varactors or logic circuits with variable delay.

Figure 14A:
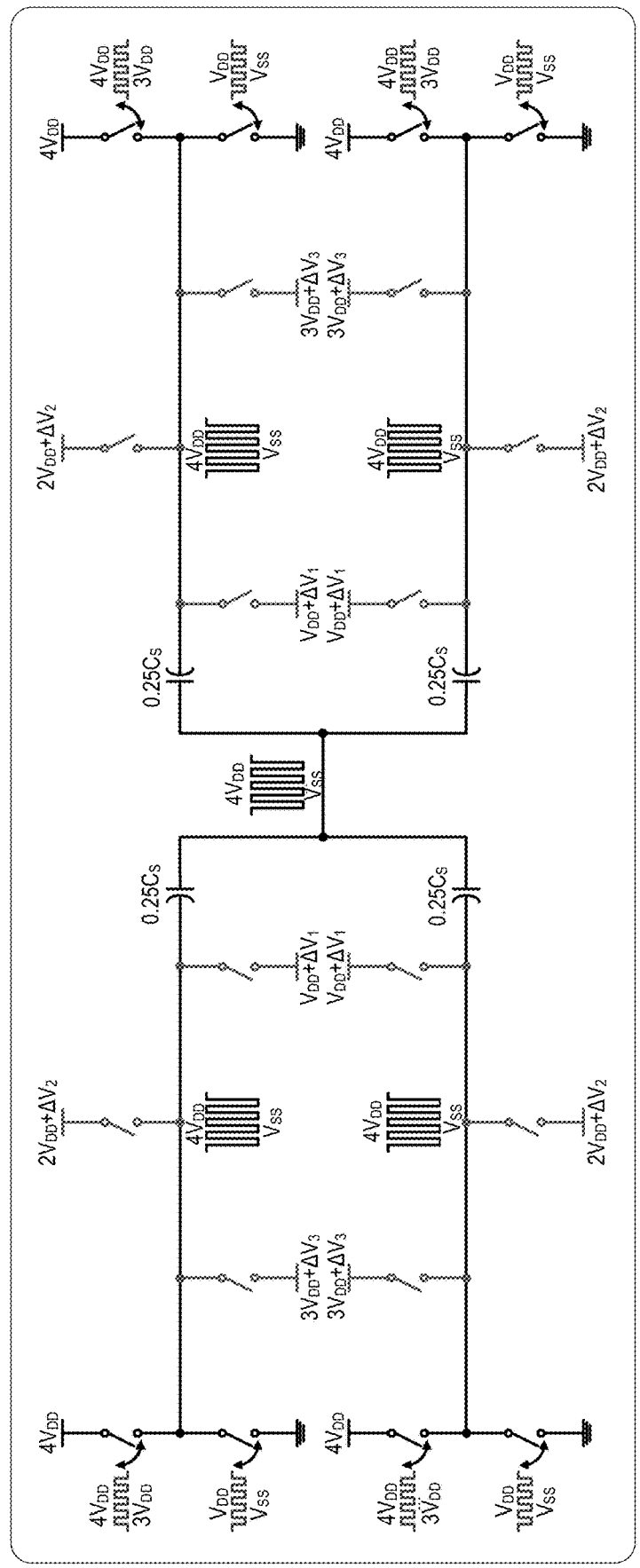
FIGS. 14A-D are exemplary schematics showing four examples of expansion implementations using multiple voltage supplies.
Figure 14B:
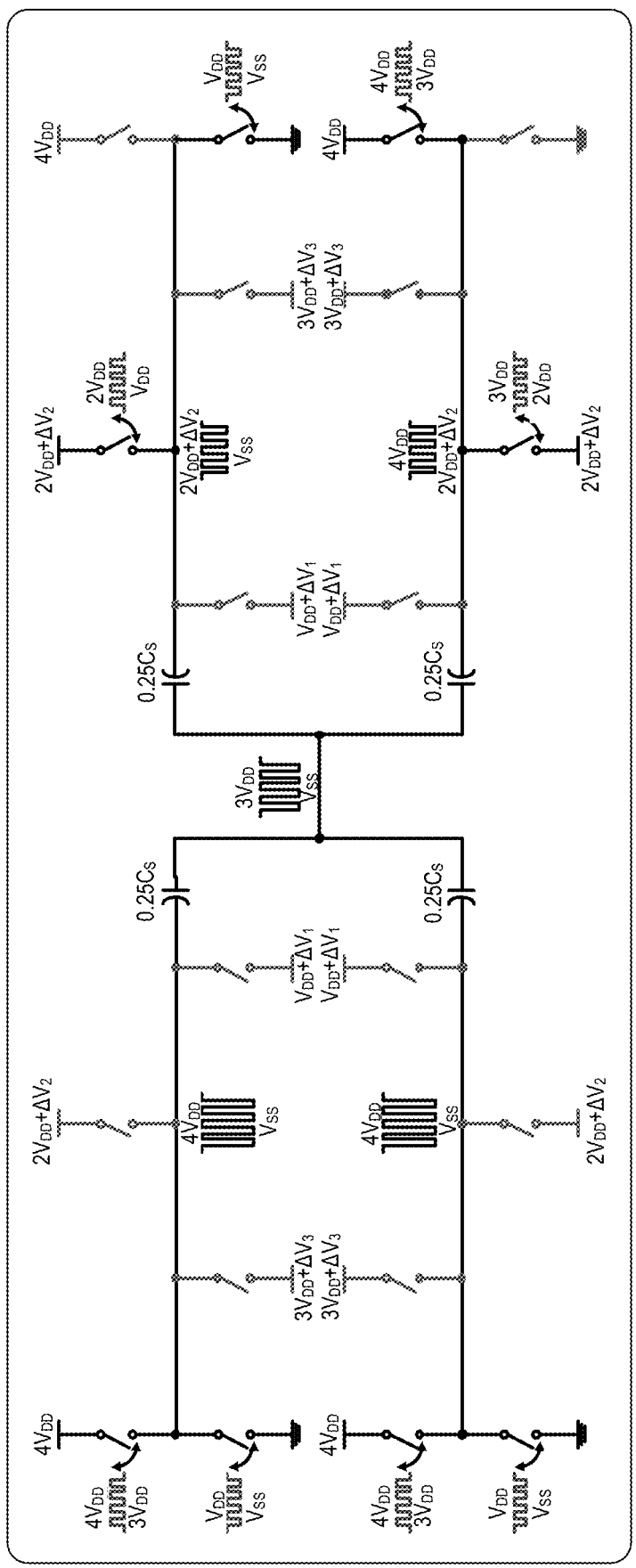
Figure 14C:
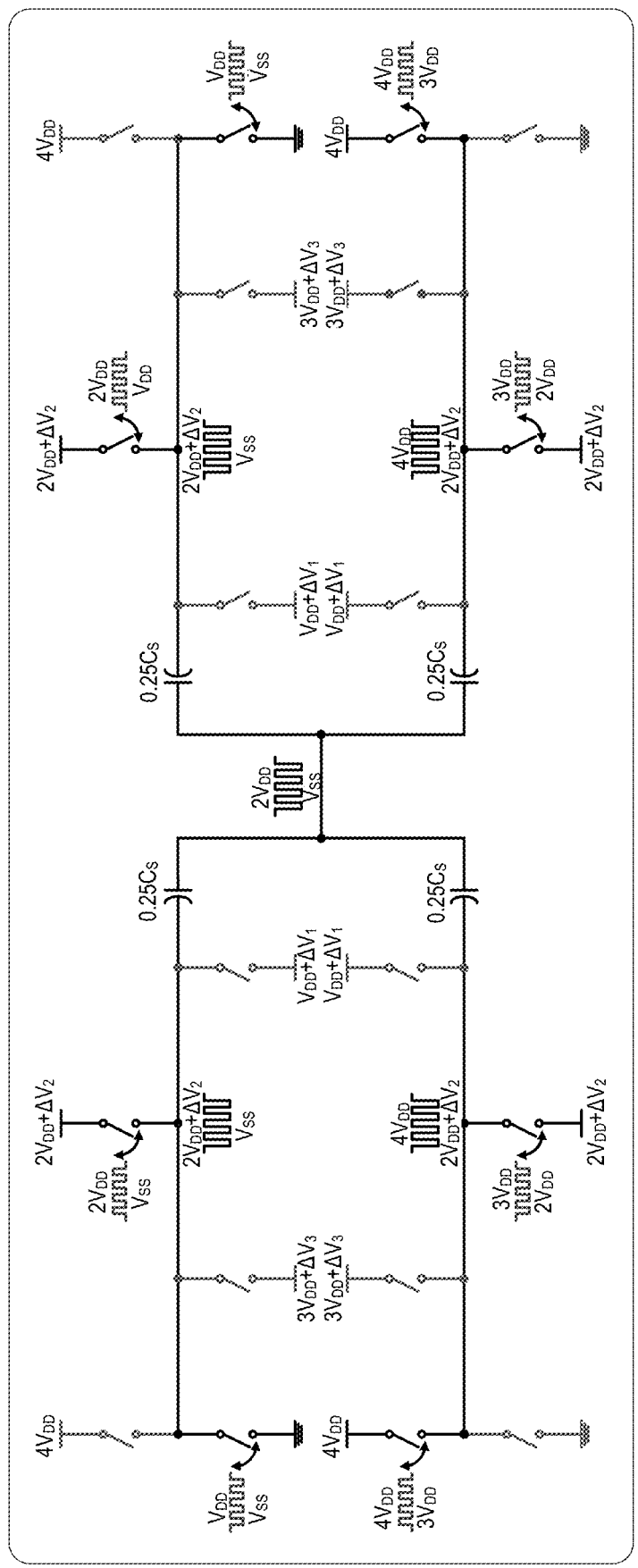
Figure 14D:
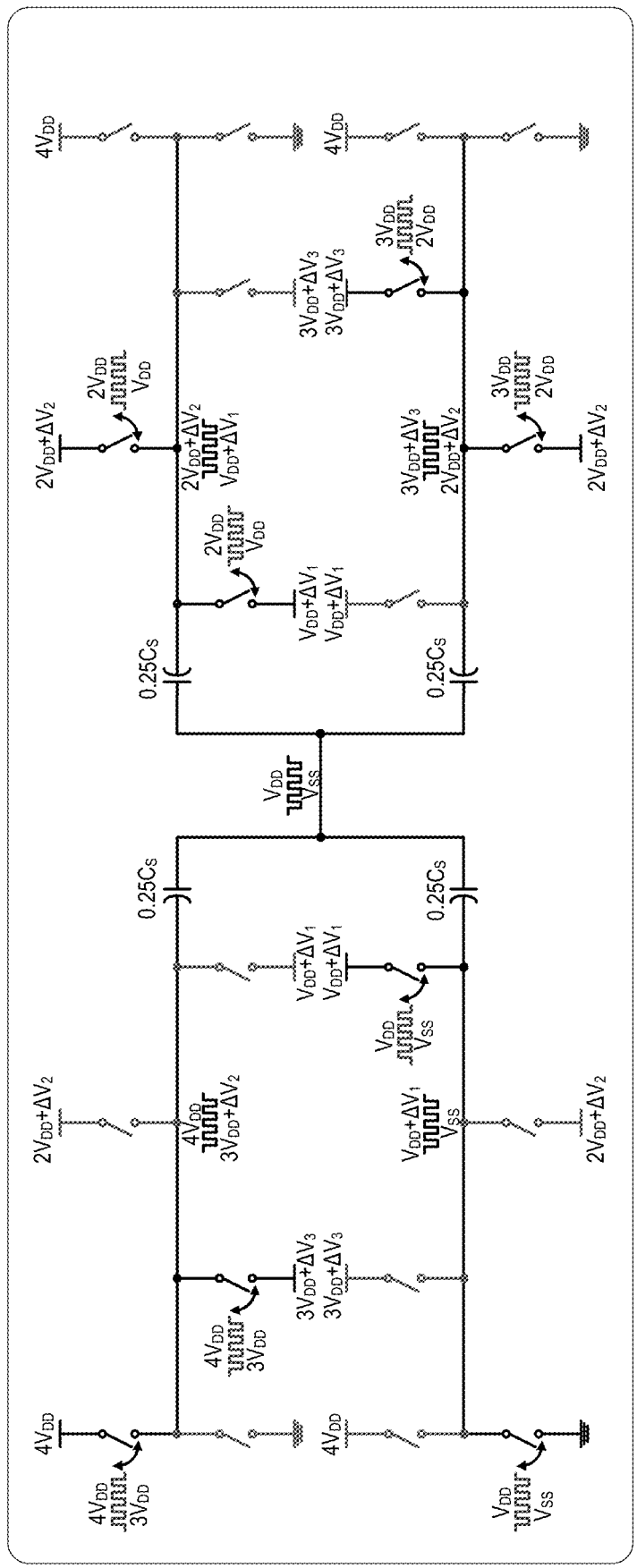

FIGS. 14A-D depict four examples of expansion implementations using multiple voltage supplies. FIG. 14A depicts four voltage supplies with amplitudes of $V_{DD4}-V_{SS}$. FIG. 14B depicts four voltage supplies with amplitudes of $V_{DD3}-V_{SS}$. FIG. 14C depicts four voltage supplies with amplitudes of $V_{DD2}-V_{SS}$. FIG. 14D depicts four voltage supplies with amplitudes of $V_{DD}-V_{SS}$.

FIGS. 15A-B are an exemplary schematics showing an area- and power-efficient switch for Class-G SCPA in $V_{DD2}$ mode and $V_{DD}$ mode from a conventional architecture to two different proposed architectures. Conventional architecture depicts an output stage of the Class-G power amplifier. In FIGS. 15A-B, the output stage operates with dual supply voltages $V_{DD2}$ and $V_{DD}$. For the $V_{DD2}$ mode (FIG. 15A), MP1 and MN1 receive input signals. On the other hand, MP3 and MN1 receive input signals in $V_{DD}$ mode as shown in the figure. MN3 is used for the $V_{DD}$ mode (FIG. 15B) as a power switch. MN3 is connected to MP3. MN3 also prevents leakage between $V_{DD}$ and the output of cascoded transistors during $V_{DD2}$ mode. Cascode transistors, MP2 and MN2, are used to prevent excessive gate to drain or gate to source voltage stress for all of the transistors. In conventional architecture, the MP3 requires additional area and power consumption due to its own junction parasitic capacitance.

In the proposed architectures of FIGS. 15A-B, to minimize the additional area and power consumption, an MP3-free architecture is proposed. The MP2 receives input signal for the $V_{DD}$ mode instead of MP3 and its operation is the same as the conventional architecture, while MN3 is connected to MP2 and MP1. In the proposed architectures, the MP2 can be split into two pieces, MP2A and MP2B, as shown in FIGS. 15A-B to reduce charging and discharging energy for the parasitic capacitance of the MP2. Even if the example is for the two pieces, it can be extended to multiple pieces of more than two.

For a simplified explanation, the proposed switch is described without the supply-voltage-insensitive switch structure, but it is applied to both split switches as shown in FIGS. 12A-B. In low power mode in the conventional switch for Class-G operation, MP3 switches at carrier frequency while MN3 is on to provide $V_{DD}$ to the switching network. The proposed switch architecture removes MP3 from the conventional switch and reuses an existing cascode transistor, MP2, as a switching device in $V_{DD}$ mode in order to reduce the parasitic capacitance at the switch output. Furthermore, if the on-resistance of MN3 is small, only a part of MP2 needs to be switched when it operates from $V_{DD}$ to save the dynamic power consumption in the buffer chain that drives MP2. In this design, only half of the MP2 is used for the MP2A that switches in the $V_{DD}$ mode. The gate of the remaining transistor, MP2B, is biased at $V_{DD}$ and is turned off in the $V_{DD}$ mode.

Delay Mismatch Compensation Scheme for
Class-G SCPA

Figure 16:
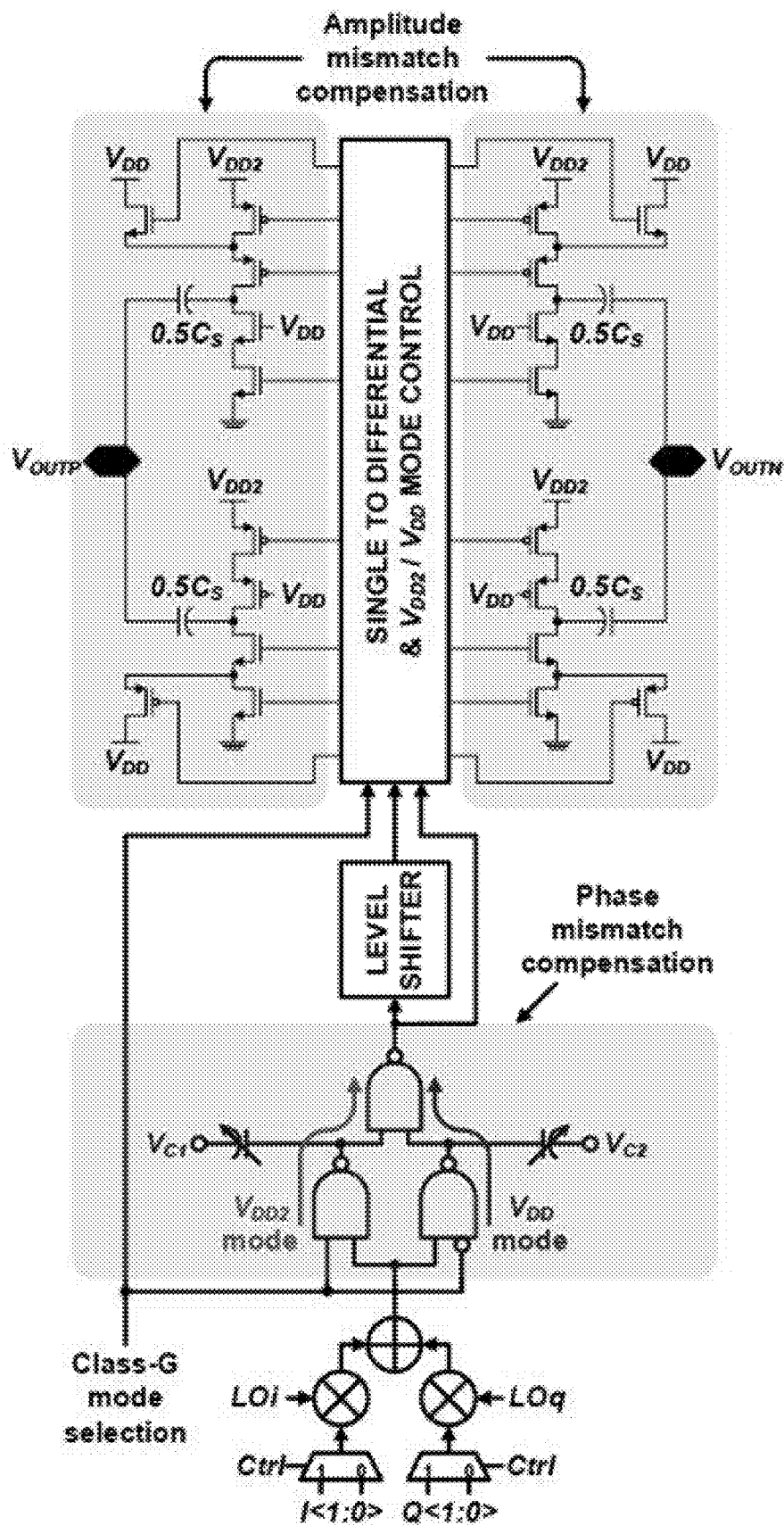
FIG. 16 is an exemplary schematic showing a phase mismatch compensation technique for Class-G SCPA.

Although there is no amplitude mismatch between $V_{DD2}$ and $V_{DD}$ modes when $V_{DD2}$ and $V_{DD}$ are ideally matched, a delay mismatch can exist because the proposed SCPA operates with two different supply voltages. The delay mismatch in the two different signal paths will directly result in a phase mismatch. It is noted that any difference in buffer size to drive NMOS/PMOS switches of different sizes will make a difference in the switching time. Parasitic capacitance also cannot be exactly matched with a different fanout. Furthermore, the supply voltage difference can result in an even larger variation in signal delay due to different switching time. An ideal switch can be the best solution to eliminate the phase mismatch. However, an efficient compensation technique for the delay (phase) mismatch is required with finite switch performance. It is more significant at a higher frequency because the same delay mismatch translates to a larger phase mismatch at the higher operating frequency. In this design, a dynamic path delay control scheme is proposed to compensate for the non-ideal switching performance of the transistor switch as shown in FIG. 16. A path-dependent adjustable delay is introduced to match the delay in both $V_{DD2}$ and $V_{DD}$ modes. The proposed delay control technique minimizes the mismatch by aligning the output signals from the different supply voltages. The signal path is changing dynamically according to the two Class-G operation modes, and each of the paths has its own delay cell to control the delay independently.

The techniques described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various systems may also be used with programs in accordance with the teachings herein, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein.

What is claimed is:

1. A digital-to-analog converter, comprising:
a plurality of digital amplifier cells connected in parallel, each digital amplifier cell is configured to receive a digital input signal and includes a switching circuit driving one or more capacitors;
the switching circuit has a first supply voltage and a second supply voltage designed to differ from each other in amplitude by a predefined ratio, wherein the switching circuit is configured to cancel an error between the predefined ratio and a ratio of the amplitude of the first supply voltage and the amplitude of the second supply voltage while outputting a voltage to the one or more capacitors and where the switching circuit cancels the error by averaging output voltage from two distinct switched subcircuits connected together at a summing node; and
a control circuit interfaced with each digital amplifier cell in the plurality of digital amplifier cells and operable to supply the digital input signals to the plurality of digital amplifier cells, wherein each digital amplifier cell includes a phase compensation circuit and the phase compensation circuit is configured to compensate for phase difference between the two distinct switched subcircuits.

2. The digital-to-analog converter digital wireless transmitter of claim 1 wherein the predefined ratio is two to one.

3. The digital-to-analog converter of claim 1 wherein the switching circuit includes three or more supply voltages.

4. The digital-to-analog converter of claim 1 wherein, each subcircuit includes a first circuit branch, a second circuit branch and a reference circuit branch, wherein the first circuit branch is coupled between the first supply voltage and a switch output node and includes a first switch, wherein the second circuit branch is coupled between the second supply voltage and the switch output node and includes a second switch, wherein the reference circuit branch is coupled between the switch output node and a reference voltage and includes a reference switch, such that the reference voltage is lower than the first supply voltage and the second supply voltage; a first capacitor electrically coupled between the switch output node of one subcircuit and the summing node; and a second capacitor electrically coupled between the switch output node of the other subcircuit and the summing node.

5. The digital-to-analog converter of claim 4, wherein, during a high power mode, the control circuit actuates the first switch and the reference switch in each of the subcircuits while the second switch in each of the subcircuits is in an open position.

6. The digital-to-analog converter of claim 5 wherein, during a low power mode, the control circuit actuates the second switch in each of the subcircuits while actuating the first switch in one of the two subcircuits and actuating the reference switch in the other of the two subcircuits.

7. The digital-to-analog converter of claim 4 wherein the control circuit, during a high power mode, switches both of the two subcircuits between the first supply voltage and the reference voltage; and, during a low power mode, switches the one of the two subcircuits between the first supply voltage and the second supply voltage while switching the other of the two subcircuits between the second supply voltage and the reference voltage.

8. A digital amplifier cell, comprising:
a switching circuit comprised of two subcircuits connected together at a summing node, each subcircuit includes a first circuit branch, a second circuit branch and a reference circuit branch,
wherein the first circuit branch is coupled between a first supply voltage and a switch output node and includes a first switch,
wherein the second circuit branch is coupled between a second supply voltage and the switch output node and includes a second switch,
wherein the reference circuit branch is coupled between the switch output node and a reference voltage and includes a reference switch, such that the first supply voltage is designed to differ in amplitude from the second supply voltage by a predefined ratio and the reference voltage is lower than the first supply voltage and the second supply voltage;
a first capacitor coupled between one of the two subcircuits and the summing node;
a second capacitor coupled between the other of the two subcircuits and the summing circuit; and
a controller interfaced with the first switch, the second switch and the reference switch in each of the subcircuit, wherein during a high power mode, the controller switches the both of the two subcircuits between the first supply voltage and the reference voltage; and, during a low power mode, switches the one of the two subcircuits between the first supply voltage and the second supply voltage while switching the other of the two subcircuits between the second supply voltage and the reference voltage.

9. The digital amplifier cell of claim 8 wherein the first supply voltage has a magnitude twice the second supply voltage.

10. The digital amplifier cell of claim 8 wherein the first switch is comprised of two metal-oxide-semiconductor field-effect transistors (MOSFETs) with p-type channels arranged in series, the second switch is comprised of a MOSFET with n-type channel, and the reference switch is comprised of two MOSFETs with n-type channels arrange in series, such that a source terminal of the MOSFET which comprises the second switch is electrically coupled to a node interconnecting the two MOSFETs which comprise the first switch.

11. The digital amplifier cell of claim 10 wherein, during a high power mode, an input signal is applied to a gate terminal of one of the two MOSFETs which comprise the first switch; and during a low power mode, the input signal is applied to a gate terminal of other of the two MOSFETs which comprise the first switch.

12. The digital amplifier cell of claim 8 wherein the first switch is comprised of two metal-oxide-semiconductor field-effect transistors (MOSFETs) with p-type channels arranged in series, the second switch is comprised of two MOSFETs arranged in series, and the reference switch is comprised two MOSFETs with n-type channels arranged in series, wherein a top MOSFET of the two MOSFETs comprising the second switch has an n-type channel with a drain terminal electrically coupled to the second supply voltage and a source terminal electrically coupled to a node interconnecting the two MOSFETs which comprise the first switch, and a bottom MOSFET of the two MOSFETs comprising the second switch has a p-type channel with a source terminal electrically coupled to the source terminal of the top MOSFET and a drain terminal electrically coupled to the switch output node.

13. The digital amplifier cell of claim 12 wherein, during a high power mode, an input signal is applied to a gate terminal of one of the two MOSFETs which comprise the first switch; and during a low power mode, the input signal is applied to a gate terminal of other of the two MOSFETs which comprise the first switch.

14. The digital amplifier cell of claim 8 wherein the summing node of the switching circuit is electrically coupled to an inductor.

15. The digital amplifier cell of claim 8 wherein the summing node of the switching circuit is electrically coupled to another amplifier circuit.

16. A digital-to-analog converter, comprising:
a plurality of digital amplifier cells connected in parallel, each digital amplifier cell is configured to receive a digital input signal and includes a switching circuit driving one or more capacitors;
the switching circuit has a first supply voltage and a second supply voltage designed to differ from each other in amplitude by a predefined ratio, wherein the switching circuit is configured to cancel an error between the predefined ratio and a ratio of the amplitude of the first supply voltage and the amplitude of the second supply voltage while outputting a voltage to the one or more capacitors; and
a control circuit interfaced with each digital amplifier cell in the plurality of digital amplifier cells and operable to supply the digital input signals to the plurality of digital amplifier cells;
wherein the switching circuit further comprises two subcircuits connected together at a summing node,
each subcircuit includes a first circuit branch, a second circuit branch and a reference circuit branch,
wherein the first circuit branch is coupled between the first supply voltage and a switch output node and includes a first switch,
wherein the second circuit branch is coupled between the second supply voltage and the switch output node and includes a second switch,
wherein the reference circuit branch is coupled between the switch output node and a reference voltage and includes a reference switch, such that the reference voltage is lower than the first supply voltage and the second supply voltage;

a first capacitor electrically coupled between the switch output node of one subcircuit and the summing node;

a second capacitor electrically coupled between the switch output node of the other subcircuit and the summing node; and wherein, dining a high power mode, the control circuit actuates the first switch and the reference switch in each of the subcircuits while the second switch in each of the subcircuits is in an open position.

17. The digital-to-analog converter of claim 16 wherein, during a low power mode, the control circuit actuates the second switch in each of the subcircuits while actuating the first switch in one of the two subcircuits and actuating the reference switch in the other of the two subcircuits.

18. The digital-to-analog converter of claim 16 wherein the control circuit, during the high power mode, switches both of the two subcircuits between the first supply voltage and the reference voltage; and, during a low power mode, switches the one of the two subcircuits between the first supply voltage and the second supply voltage while switching the other of the two subcircuits between the second supply voltage and the reference voltage.

\* \* \* \* \*